United States Patent [19]
Ishibashi et al.

[11] Patent Number: 5,347,233
[45] Date of Patent: Sep. 13, 1994

[54] PLL CIRCUIT APPARATUS AND PHASE DIFFERENCE DETECTING CIRCUIT APPARATUS

[75] Inventors: Atsuhiko Ishibashi; Harufusa Kondoh; Masaya Kitao, all of Hyogo, Japan

[73] Assignee: Mitsubishi Denki Kabushiki Kaisha, Tokyo, Japan

[21] Appl. No.: 40,314

[22] Filed: Mar. 30, 1993

[30] Foreign Application Priority Data

Apr. 2, 1992 [JP] Japan ................................. 4-081057
Sep. 11, 1992 [JP] Japan ................................. 4-243164

[51] Int. Cl.$^5$ ............................................. H03L 7/00
[52] U.S. Cl. ............................................. 331/2; 331/17; 331/25
[58] Field of Search ............... 331/2, 15, 17, 25, 109, 331/DIG. 2, 1 R; 307/510, 269, 262, 303

[56] References Cited
U.S. PATENT DOCUMENTS

| | | | |
|---|---|---|---|
| 4,301,423 | 11/1981 | Mulder | 331/1 R |
| 4,536,718 | 8/1985 | Underhill | 331/16 |
| 4,546,329 | 10/1985 | Unger | 331/16 |
| 4,614,917 | 9/1986 | Zelitzki et al. | 331/1 A |
| 4,667,168 | 5/1987 | Shiomi et al. | 331/8 |
| 4,689,581 | 8/1987 | Talbot | 331/1 A |
| 4,814,640 | 3/1989 | Miyake | 307/304 |
| 4,943,787 | 7/1990 | Swapp | 331/2 |
| 4,994,762 | 2/1991 | Tay | 331/2 |
| 5,038,115 | 8/1991 | Myers et al. | 331/2 |
| 5,084,685 | 1/1992 | Moller et al. | 331/1 A |
| 5,122,679 | 6/1992 | Ishii et al. | 307/269 |
| 5,142,247 | 8/1992 | Lada, Jr. et al. | 331/14 |

FOREIGN PATENT DOCUMENTS 62-199119 9/1987 Japan ................................. 331/2

OTHER PUBLICATIONS

"Design of PLL-Based Cloc Generation Circuits", by Deog-Kyoon Jeong et al., IEEE Journal of Solid-State Circuits, vol. SC-22, No. 2, Apr. 1987, pp. 255-261.

*Primary Examiner*—Raymond A. Nelli
*Attorney, Agent, or Firm*—Lowe, Price, LeBlanc & Becker

[57] ABSTRACT

A PLL circuit apparatus in accordance with the present invention includes a phase comparator, a delay circuit, a NOR circuit, and a loop filter. The phase comparator detects a phase difference between a reference clock signal and an internal clock signal. The delay circuit delays the reference clock signal by a delay time of an output of the phase comparator. The NOR circuit determines which pulse width is larger of a phase difference detecting signal from the phase comparator or of the delayed reference clock signal. The loop filter has its gain changed in response to an output of the NOR circuit. Thus, it is possible to shorten a synchronization pull-in time and accurately detect a deviation in synchronization. In addition, if a gain control signal is reset on the basis of logic states of a reference clock signal and an internal clock signal in accordance with rising edges and falling edges of the clock signals, it is possible to generate successive gain control signals.

20 Claims, 33 Drawing Sheets

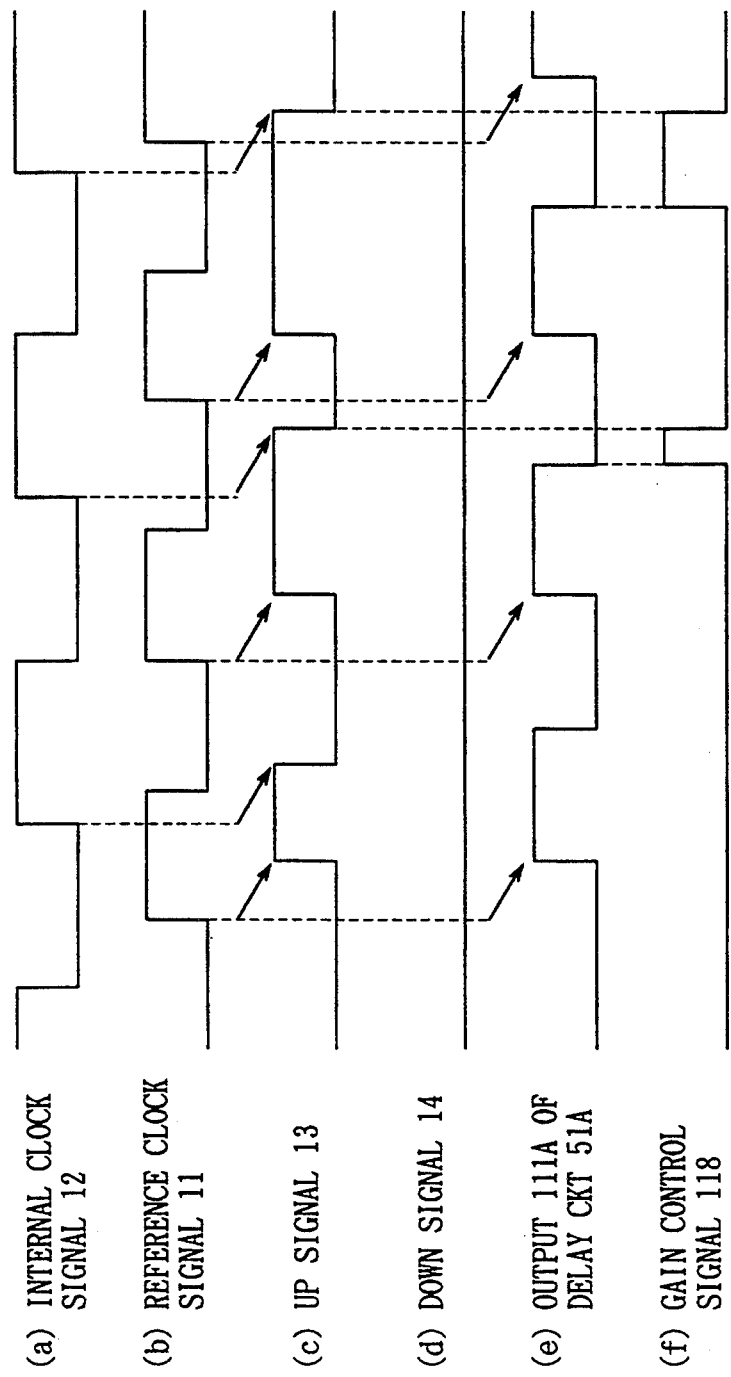

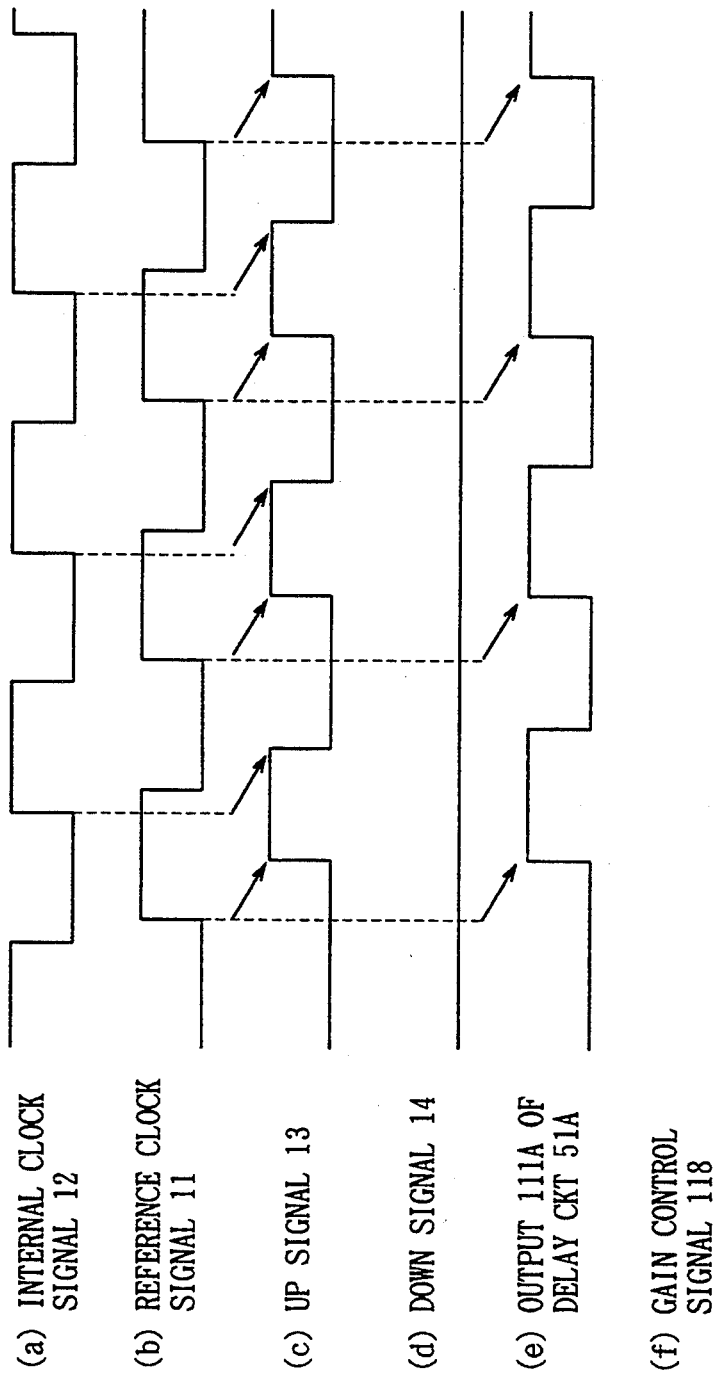

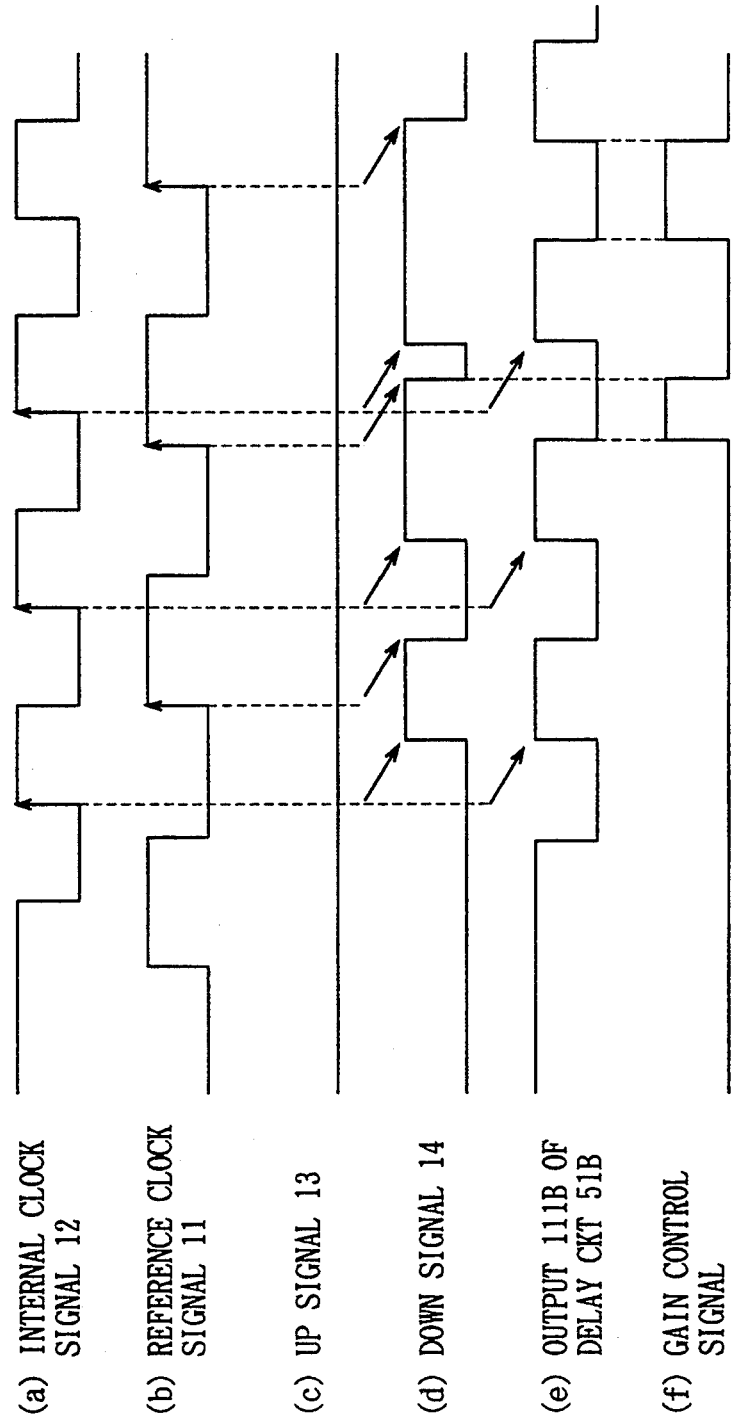

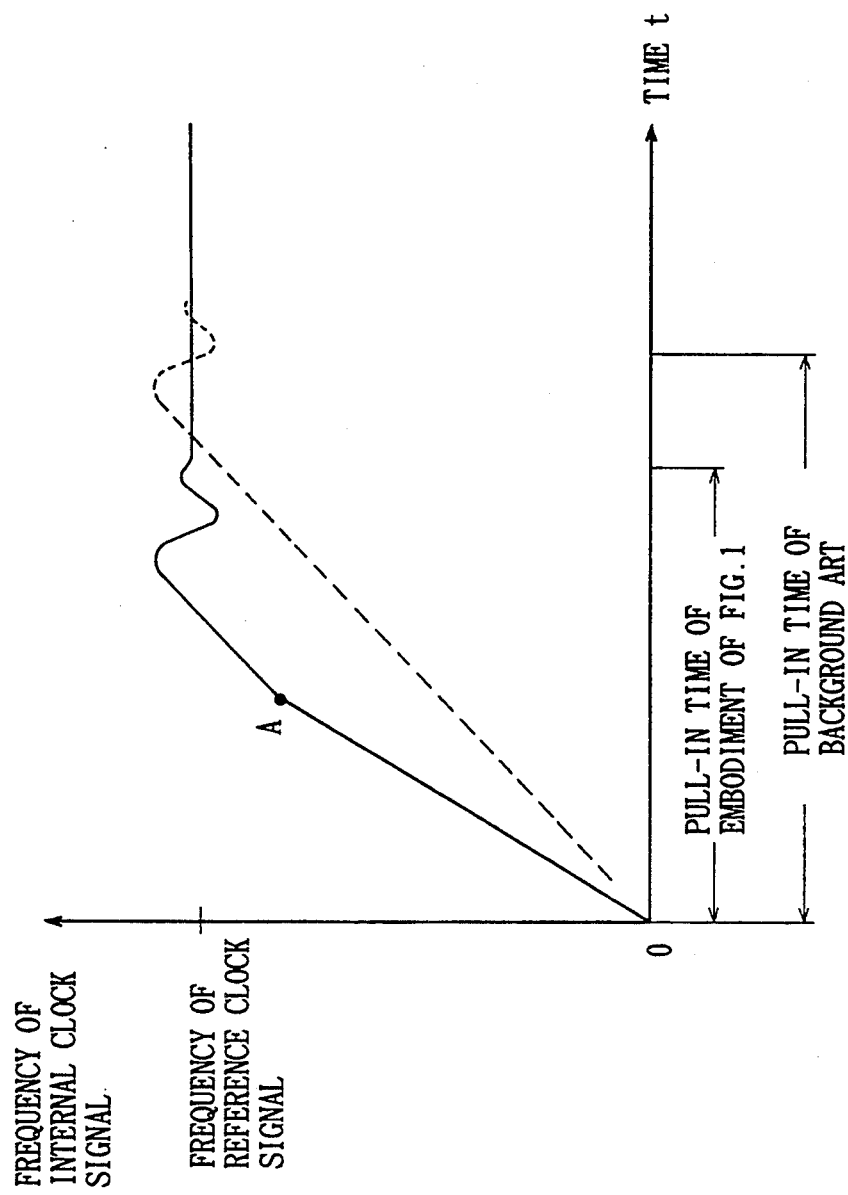

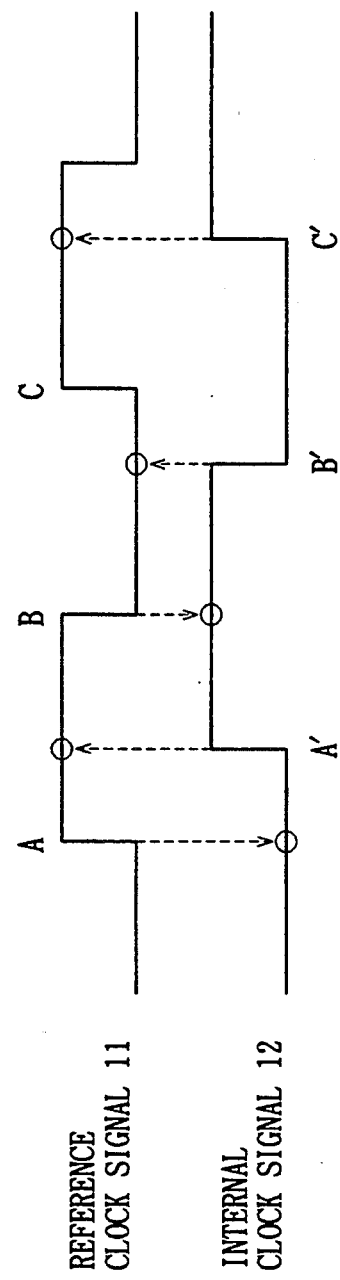

FIG. 24

| UP GAIN CONTROL SIGNAL | DOWN GAIN CONTROL SIGNAL | NAND106 OUTPUT | NOR107 OUTPUT |
|---|---|---|---|
| 0 | 0 | 1 | 1 |
| 1 | 0 | 1 | 0 |
| 0 | 1 | 1 | 0 |
| 1 | 1 | 0 | 0 |

PLL CIRCUIT APPARATUS AND PHASE DIFFERENCE DETECTING CIRCUIT APPARATUS

BACKGROUND OF THE INVENTION

1. Field of the Invention

The present invention relates generally to PLL circuit apparatuses of an analog control system and phase difference detecting circuit apparatuses employed in the PLL circuit apparatuses and, more particularly, to a PLL circuit apparatus and a phase difference detecting circuit apparatus capable of controlling a gain of a loop filter at a high speed.

2. Description of the Background Art

Recently, with faster operation of semiconductor large scale integrated circuit devices (hereinafter referred to as LSIs), frequency of a reference clock signal to be a reference of the entirety of a system has drastically become a higher frequency. This reference clock signal is applied to each of the LSIs in the system and distributed to a plurality of loads by a driver in each LSI. However, since an operation speed of the drivers varies depending on the loads, a problem arises that a phase deviation of clock signals between the plurality of LSIs occurs. In order to solve this problem, it is considered that PLL circuits are each provided for all of the plurality of LSIs so as to synchronize phases of an input and an output of each driver.

FIG. 25 is a block diagram of a system in which PLL circuit apparatuses are distributed to respective LSIs in view of the above idea and shows the background of the invention.

With reference to FIG. 25, this system includes a CPU 200, a data bus 201, a reference clock signal line 11, and a plurality of LSIs 202-206 connected to the data bus 201 and the reference clock signal line 11. The CPU 200 transmits a data signal onto the data bus 201 and also transmits a reference clock signal onto the reference clock signal line 11 for making synchronization with each of the LSIs 202-206. Each of the LSIs 202-206 includes PLL circuits 207 and loads 208 and the like therein. In the following description, the reference characters of the signal lines are matched with those of signals for use.

In operation, a reference clock signal 11 transmitted from the CPU 200 is applied to each of the LSIs 202-206, and the PLL circuit 207 incorporated in each LSI generates an internal clock signal 12 which is synchronized in phase with the applied reference clock signal. By use of the internal clock signal thus generated, it is possible to solve the problem of a phase deviation due to the data bus in the system and the driver in each LSI.

FIG. 26 is a block diagram of a PLL circuit 207 of background art for use in the system of FIG. 25. The PLL circuit shown in FIG. 26 is an example of a PLL circuit of background art employing a voltage-controlled oscillator (hereinafter referred to as VCO) described in, for example, IEEE JOURNAL OF SOLID-STATE CIRCUITS, VOL. 22, No. 2; Apr. 1987, pp. 255-261. With reference to FIG. 26, this PLL circuit apparatus includes a phase comparator 1, a charge pump circuit 2, a loop filter 3, a VCO 4 and an inverter (driver) 5. The phase comparator 1 compares a rising phase of a reference clock signal 11 to be a reference of phase synchronization and a rising phase of an internal clock signal 12 applied from the driver 5. When those rising phases are not in synchronization with each other, the phase comparator 1 outputs either an up signal 13 or a down signal 14. The charge pump circuit 2 receives the up signal 13 or the down signal 14 to output positive or negative charges in the form of pulses. The loop filter 3 smoothes an output of the charge pump circuit 2 and stores the smoothed output therein. This loop filter 3 includes resistors R1 and R2 and a capacitor C1. The gain of a loop is determined by those elements R1, R2 and C1. The VCO 4 changes an oscillation frequency in accordance with an output potential of the loop filter 3. The driver 5 generates an internal clock signal output from the VCO 4 in a desired duty ratio and applies the generated signal to a load in each LSI.

An operation of this PLL circuit apparatus will now be described with reference to FIGS. 27 and 28. FIGS. 27 and 28 are timing charts showing the operation of the PLL circuit apparatus shown in FIG. 26. FIG. 27 shows a case where the frequency of the internal clock signal is lower than that of the reference clock signal; and FIG. 28 shows a case where the frequency of the internal clock signal is higher than that of the reference clock signal. Referring to FIGS. 27 and 28, (a) represents the waveform of the internal clock signal; (b), the waveform of the reference clock signal; (c), the waveform of the up signal; (d), the waveform of the down signal; and (e), an output waveform of the loop filter 3.

First, in the case with FIG. 28, i.e., when the frequency of the internal clock signal is lower than that of the reference clock signal, the phase comparator 1 generates a pulse corresponding to a period of time from each rising of the reference clock signal to a rising of the internal clock signal immediately after the rising of the reference clock signal. This pulse is output onto the up signal line after a certain delay time (FIG. 28(c)). At the same time, the phase comparator 1 outputs a signal of a logic low level (or an "L" level) onto the down signal line (FIG. 28(d)). In response to this, the charge pump circuit 2 applies positive charges to the loop filter 3, however, because of a time constant of the resistors R1, R2 and the capacitor C1 of the loop filter 3, an output potential 18 of the loop filter 3 does not quickly rise but gradually rises by an integration operation (FIG. 28(e)). Consequently, the VCO 4 raises the oscillation frequency little by little, and hence, the phase of the internal clock signal becomes close to the phase of the reference clock signal. Similarly, in the case with FIG. 27, i.e., when the frequency of the internal clock signal is higher than that of the reference clock signal, the phase comparator 1 generates a pulse corresponding to a period of time from each rising of the internal clock signal to a rising of the reference clock signal immediately after the rising of the reference clock signal. This pulse is output onto the down signal line after a certain delay time. At the same time, the phase comparator 1 outputs a signal of a logic low level onto the up signal line. Accordingly, the charge pump circuit 2 applies negative charges to the loop filter 3, however, because of a time constant of the resistors R1 and R2 and the capacitor C1 of the loop filter 3, the output potential 18 of the loop filter 3 does not rise quickly but gradually falls by an integration operation. Consequently, the VCO 4 lowers the oscillation frequency little by little, and hence, the phase of the internal clock signal becomes close to the phase of the reference clock signal.

After the above operation, if both the phase and the frequency of the internal clock signal approximately match those of the reference clock signal, the amount of charges to be applied to the loop filter 3 by the charge pump circuit 2 becomes very small; however, because of the time constant of the loop filter 3, a slight amount of charges are integrated, so that the output potential 18 becomes almost constant. Thus, the VCO 4 keeps outputting clock signals provided when there is a match in phase and frequency, and the PLL circuit apparatus keeps maintaining the synchronization state of the reference clock signal and the internal clock signal.

Since the conventional PLL circuit apparatus of the analog system is thus structured, it is necessary to increase the time constant of the loop filter 3 so as to make the output of the loop filter 3 stable, in order to prevent a variation in the output of the VCO 4 in the state of phase synchronization. Thus, there is a problem that a period of time from time that the reference clock signal is applied to time that the phase of the internal clock signal is synchronized (synchronization pull-in time) becomes longer.

A PLL circuit apparatus for eliminating the above-described disadvantage is disclosed in Japanese Patent Laying-Open No. 62-199119.

FIG. 29 is a schematic block diagram of the PLL circuit apparatus shown in the above Patent Laying-Open. With reference to FIG. 29, this PLL circuit apparatus is different from one shown in FIG. 26 in that a loop filter 302 having two stages of loop gains is provided in place of the loop filter having one stage of loop gain and that a pull-in detector 301 is added. The loop filter 302 includes a switch circuit SW1 for setting the gain of the loop filter to be higher. The pull-in detector 301 serves to turn the switch circuit SW1 on to set the loop gain to be higher when a frequency difference between a reference clock signal 11 and an internal clock signal 12 is large, and it serves to turn the switch circuit SW1 off to set the loop gain to be lower after the frequency is pulled in. This enables a faster frequency pull-in.

FIG. 30 is a circuit diagram of the pull-in detector 301 shown in FIG. 29. With reference to FIG. 30 this pull-in detector 301 includes comparison circuits 401 and 402, NOR gates 403 and 404 and a counter 405.

In operation, the comparison circuits 401 and 402 compare an output voltage $V\phi$ which is in proportion to a phase difference from the charge pump circuit 2 with reference voltages Vr1 and Vr2 into which a supply voltage Vcc is divided by a resistance. When $V\phi > Vr1$, the comparison circuit 401 outputs "1". When $V\phi < Vr2$, the comparison circuit 402 outputs "1". When $Vr1 > V\phi > Vr2$, each of the comparison circuits 401 and 402 outputs "0". The NOR gate 403 outputs an output signal "0" when an output signal of the comparison circuit 401 or 402 is "1", while it outputs an output signal "1" when output signals of both the comparison circuits 401 and 402 are "0". The counter 405 is reset in response to the output signal "0" of the NOR gate 403 to output a gain control signal "0" for turning the switch circuit SW1 (FIG. 29) on. Further, the counter 405 responds to the output signal "1" of the NOR gate 403 to keep counting until pulses of the internal clock signal 12 input through the NOR gate 404 reach a predetermined number, and when the pulses reach the predetermined number, the counter 405 determines a pull-in state to output a gain control signal "1" for turning the switch circuit SW1 off.

Accordingly, the PLL circuit apparatus shown in FIGS. 29 and 30 sets the loop gain to be higher in the case with a higher frequency, and it maintains the loop gain to be higher until the output of the counter 405 attains "1" in the case with a nearly pull-in state. This enables shortening of the time required for the pull-in state.

However, since the PLL circuit apparatus shown in FIGS. 29 and 30 compares the analog output voltage $V\phi$ from the charge pump circuit 2 with the reference voltages Vr1 and Vr2, the voltages $V\phi$, Vr1 and Vr2 vary with a variation of the supply voltage. As a result, it is possible that a gain control signal for setting the loop gain to be higher despite the pull-in state is generated and that the loop gain is maintained to be lower despite a non pull-in state. That is, it is possible that malfunctions occur and the timing to generate the gain control signal is delayed.

Further, since detection of the pull-in state is made by counting the number of pulses of the internal clock signal by a predetermined number, there is a deviation from the actual pull-in state and there is a deviation between timing to generate the gain control signal for turning the switch circuit SW1 off and timing to stop that gain control signal.

SUMMARY OF THE INVENTION

One object of the present invention is to shorten a synchronization pull-in time and inhibit a change in an internal clock signal in a synchronization state in a PLL circuit apparatus.

Another object of the present invention is to accurately determine a synchronization state in a PLL circuit apparatus capable of changing a gain of a loop filter.

A further object of the present invention is to enable gain control signals to be output rapidly in a PLL circuit apparatus.

Briefly, a PLL circuit apparatus in accordance with the present invention includes an integrating circuit an internal clock signal generator, a phase difference detector, an integration controller, a reference pulse signal generator, a pulse width comparator and a gain controller. The integrating circuit performs an integrating operation of an input signal. The internal clock signal generator generates, in response to an output of the integrating circuit, an internal clock signal for internal synchronization. The phase difference detector detects a first phase different between the externally generated reference clock signal and the internal clock signal, and provides a phase difference detection pulse signal having a pulse width representing the first phase difference. The integration controller promotes, in response to the phase difference detection pulse signal from the phase difference detector, a supply of the input signal by the integrating circuit. The reference pulse width signal generator generates a reference pulse width signal having the same frequency as that of either the externally generated reference clock signal or the internal clock signal and of a predetermined pulse width. The pulse width comparator compares the pulse width of the phase difference detection pulse signal with the pulse width of the reference pulse width signal and provides an output signal representing a second phase difference of the phase difference detection pulse signal and the reference pulse width signal. The controller controls, in response to the second phase difference signal, a manner of said integrating operation of the integrating means.

In operation, the magnitude of the phase difference can precisely be determined by the comparison between the phase difference detected by the phase difference detector and the reference pulse signal having a predetermined pulse width. This makes it possible to more precisely detect a deviation in synchronization as compared to the conventional comparison between an analog output signal and a definite value, and also precisely carry out a gain control. In addition, when the phase difference is smaller than a reference pulse width, the gain of the loop filter is also decreased, while when the phase difference is larger than the pulse width, the gain is increased, thereby enabling an increase in the speed of the internal clock signal following the reference clock signal.

A PLL circuit apparatus according to another aspect of the present invention includes an integrating circuit, an internal clock signal generator, a phase difference detector, a plurality of delay units, a plurality of comparators, and a plurality of controllers. The integrating circuit has a plurality of gain constants for performing an integration operation of an input signal. The internal clock signal generator responds to an output of the loop filter to generate an internal clock signal for an internal synchronization. The phase difference detector detects a phase difference between an externally generated reference clock signal and an internal clock signal. The plurality of delay units have different delay times and delay the phase difference detected by the phase difference detector. The plurality of comparators are provided corresponding to the plurality of delay units, and each of the comparators compares the phase difference detected by the phase difference detector with the phase difference delayed by each of the delay units. The plurality of controllers are provided corresponding to the plurality of comparators and control the gains of the loop filter in response to the result of comparison by the plurality of comparators.

In operation, the phase difference detected by the phase difference detector is delayed by the plurality of delay units, and this delayed phase difference is compared with the detected phase difference. This makes it possible to detect how large a phase deviation is. Further, if the plurality of controllers control the gains of the integrating circuit in response to the result of the comparison by the comparators, then a gain corresponding to the largeness of the phase difference can be selected, thereby enabling a shortening of a synchronization pull-in time.

A PLL circuit apparatus according to still another aspect of the present invention includes, similarly to the aforementioned PLL circuit apparatus according to another aspect of the present invention, an internal clock signal generator, a phase difference detector, a first charge pump circuit, a reference pulse signal generator and a determinator, and further includes a loop filter having one time constant circuit, and a second charge pump circuit for promoting application of charges to the loop filter in response to the result of determination by the determinator.

In operation, the second charge pump circuit responds to the result of determination by the determinator to promote the amount of charges to be applied to the loop filter. Accordingly, only one loop filter is enough to be provided.

A PLL circuit apparatus according to still another aspect of the present invention includes, similarly to the aforementioned PLL circuit apparatus, a loop filter, an internal clock generator, a phase difference detector, and a first charge pump circuit, and further includes a frequency difference detector and a second charge pump circuit. The frequency difference detector detects a frequency difference between a reference clock signal and an internal clock signal. The second charge pump circuit promotes the amount of charges to be applied to the loop filter dependently on the detected frequency difference.

In operation, the frequency difference detector detects the frequency difference between the reference clock signal and the internal clock signal, and the second charge pump circuit controls gains of the loop filter in accordance with the detected frequency difference. This enables a decrease in phase difference and frequency pull-in time.

A PLL circuit apparatus according to still another aspect of the present invention includes an integrating circuit, an internal clock signal generator, a first phase difference detector, an integration controller, a second phase difference detector and a controller. The integrating circuit has at least two gain constants for performing an integrating operation of an input signal. The internal clock signal generator responds to an output of the integrating circuit to generate an internal clock signal for internal synchronization. The first phase difference detector detects a phase difference between an externally generated reference clock signal and an internal clock signal to hold a phase difference detecting signal. The integration controller responds to the phase difference detecting signal from the first phase difference detector to promote application of charge to the integrating circuit. The second phase difference detector detects that the phase difference between the internal clock signal and the reference clock signal is a predetermined time difference, and holds a phase difference detecting signal. The controller is set in response to the phase difference detecting signal held by the first phase difference detector and outputs a control signal for maintaining the integrating circuit at a high gain, while it is reset in response to the phase difference detecting signal held by the second phase difference detector and stops the output of the control signal.

In operation, when the difference between the cycle of the reference clock signal and that of the internal clock signal is not less than a predetermined time difference, the controller outputs a gain control signal for maintaining the integrating circuit at a high gain. This enables a substantial reduction in the time required to draw in the phase synchronization state. Since the controller is set in response to the phase difference detecting signal held by the first phase difference detector and reset in response to the phase difference detecting signal held by the second phase difference detector, the controller is able to rapidly output the control signal for maintaining the gain of the integrating circuit at a high level and stop the output of the control signal.

A phase difference detecting circuit apparatus according to still another aspect of the present invention includes a holding circuit, a determinator, and a control signal generating/stopping unit. The holding circuit holds a first phase difference detecting signal output from a phase comparator. The determinator determines the logic states of one of a reference clock signal and an internal clock signal at two rising edges and at a falling edge between two falling edges of the other clock signal. The control signal generating/stopping unit responds to an output of the holding circuit to generate a control signal for maintaining the gain of a loop filter at a high level, while it responds to a determination signal from the determinator to stop generation of the control signal.

In operation, since the determinator determines the logic states of one of the reference clock signal and the internal clock signal at two rising edges and at a falling edge between the two rising edges of the other clock signal, it can be detected that one cycle of one clock signal is within a half cycle length of the other clock signal. Resetting the control signal generating/stopping unit in response to the result of the determination can prevent an erroneous reset of a gain control signal as in the background art.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a timing chart of the PLL circuit apparatus shown in FIG. 1A in case where an internal clock signal is delayed as compared to a reference clock signal.

FIG. 3 is a timing chart of the PLL circuit apparatus of FIG. 1A in a case where the internal clock signal is deviated little as compared to the reference clock signal.

FIG. 4 is a timing chart of the PLL circuit apparatus of FIG. 1A in a case where the internal clock signal is advanced as compared to the reference clock signal.

FIG. 5 is a graph showing a time change of a frequency of the internal clock signal during a period between time that the reference clock signal is input to the PLL circuit apparatus and time that the internal clock signal is synchronized with the reference clock signal.

FIG. 19C is a timing chart showing the input timing of the reference clock signal and internal clock signal.

FIG. 24 is a truth table of a contention preventing portion 46.

DESCRIPTION OF THE PREFERRED EMBODIMENTS

Figure 1A:
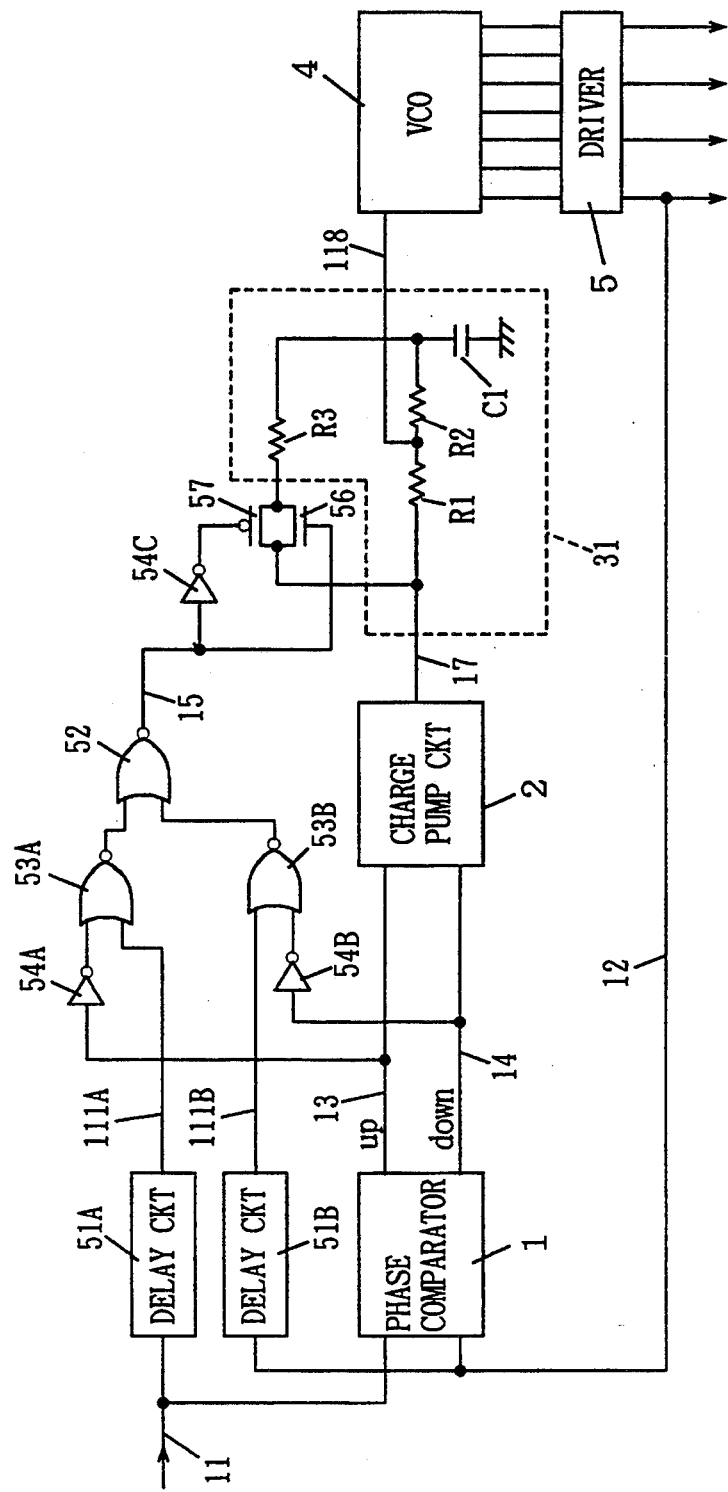
FIG. 1A is a block diagram showing a PLL circuit apparatus according to one embodiment of the present invention.

FIG. 1A is a block diagram showing one embodiment of a PLL circuit apparatus in accordance with the present invention.

With reference to FIG. 1A, this PLL circuit apparatus includes delay circuits 51A and 51B, NOR circuits 53A and 53B, an OR circuit 52, inverter circuits 54A, 54B and 54C, an NMOS transistor 56, a PMOS transistor 57 and a loop filter 31. The loop filter 31 includes a resistor R3 having one end connected to a node between a capacitor C1 and a resistor R2. Since the other circuits in FIG. 1A are the same as those shown in FIG. 20, those circuits are denoted with the same reference characters and a description thereof will not be repeated here.

The delay circuit 51A delays a reference clock signal 11 by a delay time of an UP signal 13 of an output of a phase comparator 1. The delay circuit 51B delays an internal clock signal 12 by delay time of a down signal 14 of an output of a phase comparator 1.

Figure 1B:
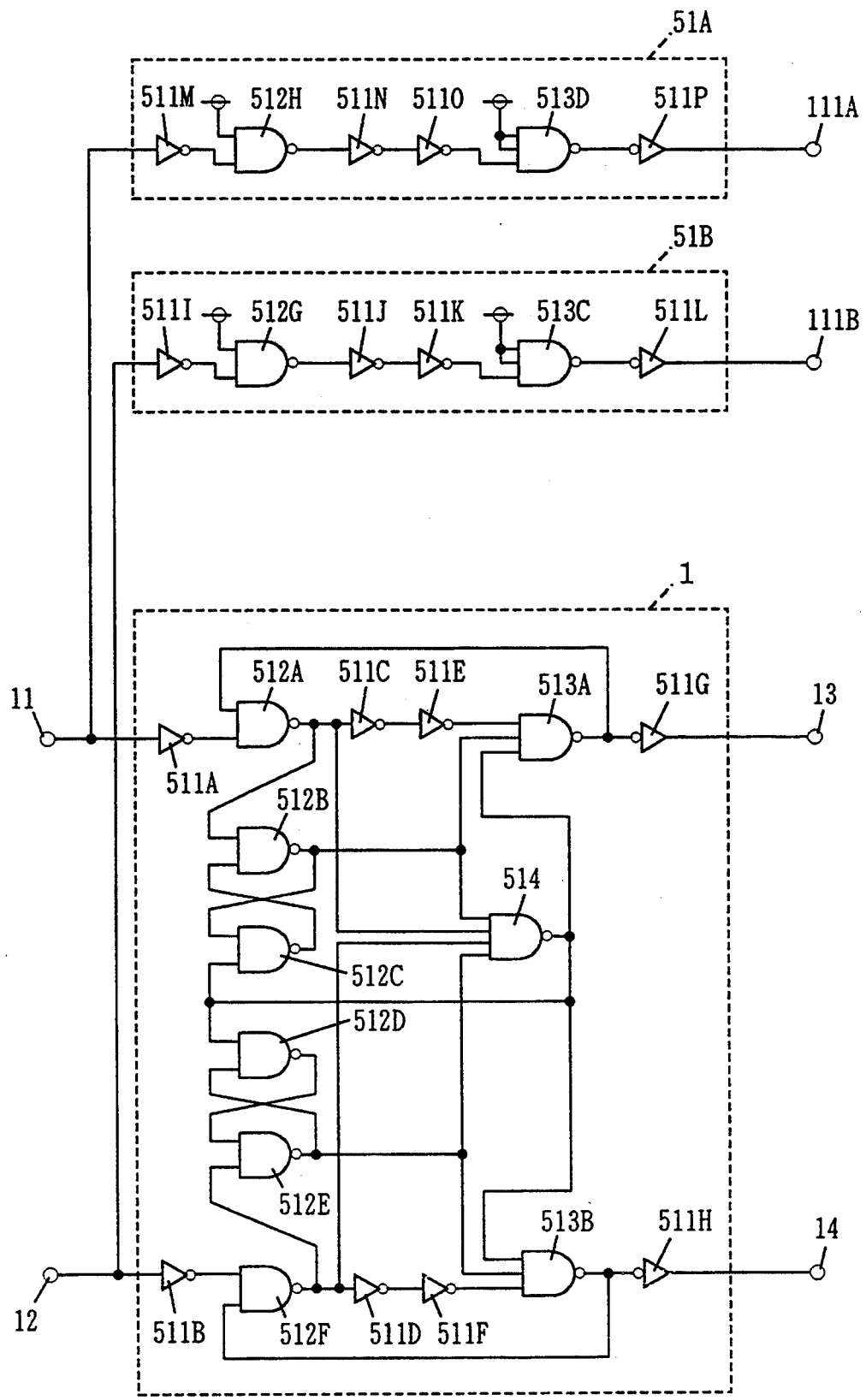
FIG. 1B is a block diagram showing delay circuits 51A and 51B and a phase comparator 1 shown in FIG. 1A.

FIG. 1B is a schematic diagram showing specific examples of the delay circuits 51A and 51B and phase comparator 1 shown in FIG. 1A. Referring to FIG. 1B, phase comparator 1 includes inverters 511A to 511H, two-input NAND gates 512A to 512F, three-input NAND gates 513A and 513B and a four-input NAND gate 514. Phase comparator 1 is shown as an example in order to show that the phase comparator 1 includes a plurality of elements and that an up signal 13 or a down signal is output after a prescribed time period from the input timing of the reference clock signal 11 and the internal clock signal 12.

Delay circuit 51A includes inverters 511M to 511P and NAND gates 512H and 513D. Inverters 511M to 511P and NAND gates 512H and 513D correspond to elements 511A, 512A, 511C, 511E, 513A and 511G coupled in series between the reference clock input terminal and the up signal output terminal of phase comparator 1.

Delay circuit 51B includes inverters 511I to 511L and NAND gates 512G and 513G. Inverters 511I to 511L and NAND gates 512G and 513C correspond to elements 511B, 512F, 511D, 511F, 513B and 511H coupled in series between the internal clock signal input terminal and the down signal output terminal of phase comparator 1.

Since delay circuits 51A and 51B are structured as described above, phases of the up and down signals of the phase comparator 1 and those of the reference clock signal and the internal clock signal can be matched.

Again referring to FIG. 1A, the NOR circuits 53A, 53B and OR circuit 52 each have two input terminals and one output terminal. The NOR circuit 53A has one input terminal connected to receive an up signal 13 by inverter circuit 54A and the other input terminal connected to receive the output of the delay circuit 51A. The NOR circuit 53B has one input terminal connected to receive a down signal 14 by inverter circuit 54B and the other input terminal connected to receive the output of the delay circuit 51B. The OR circuit 52 has one input terminal connected to the output terminal of the NOR circuit 53A, the other input terminal connected to the output terminal of the NOR circuit 53B, and its output terminal connected to an input of the inverter circuit 54C and a gate electrode of the NMOS transistor 56. The inverter circuit 54C inverts an output 15 of the OR circuit 52 and applies the inverted output to a gate electrode of the PMOS transistor 57. The PMOS transistor 57 and the NMOS transistor 56 have their drain electrodes connected in common to an output 17 of a charge pump circuit 2, and their source electrodes connected to the other end of the resistor R3. That is, the NMOS transistor 56 and the PMOS transistor 57 constitute a transfer gate by which the output of the charge pump circuit 2 and the resistor R3 are connected so as to make a time constant smaller (a loop gain larger) when an output of the OR circuit 52 is at a high level.

FIGS. 2, 3 and 4 are timing charts of the PLL circuit apparatus shown in FIG. 1A. FIG. 2 is a timing chart in the case where an internal clock signal 12 is delayed as compared to the reference clock signal 11; FIG. 3 is a timing chart in the case where the internal clock signal 12 is deviated little as compared to the reference clock signal 11; and FIG. 4 is a timing chart in the case where the internal clock signal 12 is advanced as compared to the reference clock signal 11.

With reference to FIGS. 2, 3 and 4, (a) represents the waveform of the internal clock signal 12; (b), the waveform of the reference clock signal 11; (c), the waveform of the up signal 13; (d), the waveform of the down signal 14; (e), the waveform of the output signal 111A or 111B of the delay circuit 51A or 51B; and (f), the waveform of a gain control signal 15 output from the OR circuit 52.

The operation of the PLL circuit apparatus shown in FIG. 1A will now be described with reference to FIGS. 2 to 4.

The reference clock signal 11 is applied to the delay circuit 51A and the phase comparator 1, while the internal clock signal 12 is applied to the delay circuit 51B and the phase comparator 1.

A description will now be made on the case where the internal clock signal 12 is delayed as compared to the reference clock signal 11 with reference to FIG. 2. The phase comparator 1 generates a pulse signal corresponding to a period of time from each rising phase of the reference clock signal 11 to a rising phase of the internal clock signal 12 immediately after the rising phase of the reference clock signal. This pulse signal is delayed by the comparator 1, and then output onto the up signal line after an elapse of a definite period of time. A signal of a logic low level is output onto the down signal line. The up signal 13 is applied to the input terminal of NOR circuit 53A by inverter 54H and down signal 14 is applied to the input terminals of the NOR circuit 53B by inverter 54B. The reference clock signal 11 applied to the delay circuit 51A is delayed in phase by the delay circuit 51A by the delay time of the phase comparator 1.

This delayed reference clock signal 111A is synchronized in phase with the up signal 13 and becomes a reference for use in determining the magnitude of a phase difference.

As described above, since the rising phase of the clock signal ilia output from the delay circuit 51A is approximately the same as that of the up signal 13, the gain control signal 15 output from the OR circuit 52 attains a logic high level only when the up signal is at a logic high level and the output 111A of the delay circuit 51A is at a logic low level. Thus, the magnitude of the phase difference can be precisely detected by taking a logical product of the phase-synchronized clock signal 111A or the up signal 13 being a phase difference detecting signal. This gain control signal 15 is applied to the transfer gate, so that the transfer gate is rendered conductive only during the period for which the gain control signal 15 is at a logic high level. Accordingly, the resistor R3 is connected between the output of the charge pump circuit 2 and the capacitor C1, and a time constant of the loop filter 31 decreases. Consequently, an output voltage 118 of the loop filter 31 rises more rapidly than that in the background art example, and the VCO 4 responds to this output voltage 118 to advance the phase of the internal clock signal 12.

A description will now be made on the case where there is little phase difference between the reference clock signal and the internal clock signal, with reference to FIG. 3.

When there is little phase difference between the reference clock signal 11 and the internal clock signal 12, the pulse width of the up signal 13 output from the phase comparator 1 is smaller than that of the reference clock signal 11. Accordingly, such a period does not appear that the clock signal 111 output from the delay circuit 51 is at a logic low level and the up signal 13 output from the phase comparator 1 is at a logic high level, and the gain control signal 15 remains to be at a logic low level. Thus, the transfer gate is not rendered conductive and the time constant of the loop filter 31 does not change. Consequently, the output voltage 118 of the loop filter 31 rises at the same speed as in the example of background art.

A description will now be made on an operation in the case where the internal clock signal 12 is advanced as compared to the reference clock signal 11, with reference to the timing chart of FIG. 4. The phase comparator 1 outputs a pulse corresponding to the difference in rising phase between the reference clock signal 11 and the internal clock signal 12 onto the down signal line and a signal of a logic low level onto the up signal line after an elapse of a certain delay time. The down signal 14 is applied to the NOR circuit 53B by inverter circuit 54B, and the NOR circuit 53B applies a signal in accordance with the inverted logic level of the down signal to the OR circuit 52. The OR circuit 52 takes a logical product of the inverted down signal 14 or the clock signal 111B which is synchronized in phase by delay. Thus, when the pulse width of the reference clock signal is larger than that of the down signal, it can be determined that the phase difference is large. During the period for which the phase difference is large, the gain control signal 15 attains a logic high level. The transfer gate is rendered conductive in response to the gain control signal 15 of the logic high level, so that, as described above, the resistor R3 is connected between the output of the charge pump circuit 2 and the capacitor C1 and the time constant of the loop filter 31 becomes smaller. Accordingly, a path is added through which charges are moved from the capacitor C1 via the resistor R3. As a result, the output potential 118 of the loop filter 31 falls more rapidly as compared to the example of background art.

A description will now be made on how the internal clock signal 12 changes in the above-described operation, with reference to FIG. 5. FIG. 5 is a graph showing a time change of the frequency of the internal clock signal 12 during a period between time that the reference clock signal 11 is input to the PLL circuit apparatus and time that the internal clock signal 12 is synchronized with the reference clock signal 11 when the frequency of the internal clock signal 12 is lower than the frequency of the internal clock signal. Referring to FIG. 5, a solid line represents a frequency change of the internal clock signal in this embodiment, and a broken line represents a frequency change of the internal clock signal in the background art example.

When the pulse width of the up signal 13 or down signal 14 of the phase comparator 1 is larger than that of the reference clock signal 11, i.e., the phase difference between the reference clock signal 11 and the internal clock signal 12 is larger than the pulse width of the reference clock signal 11, the frequency of the internal clock signal 12 output from the PLL circuit apparatus becomes more rapidly close to the frequency of the reference clock signal 11 as compared to the background art example. However, after the pulse width of the up signal 13 or down signal 14 becomes equal to that of the reference clock signal 11 (a point A of FIG. 5), the frequency of the internal clock signal 12 becomes close to the frequency of the reference clock signal 11 at the same speed as in the background art example. This results in a decrease in the pull-in time of the PLL circuit apparatus, and the internal clock signal after synchronization becomes identical to that in the background art example.

While the PLL circuit apparatus shown in FIG. 1A delays the reference clock signal 11 as the reference signal for determining the magnitude of the phase difference, any signal which is synchronized in phase with the up signal or the down signal can be a clock signal having a reference pulse width.

Figure 6:
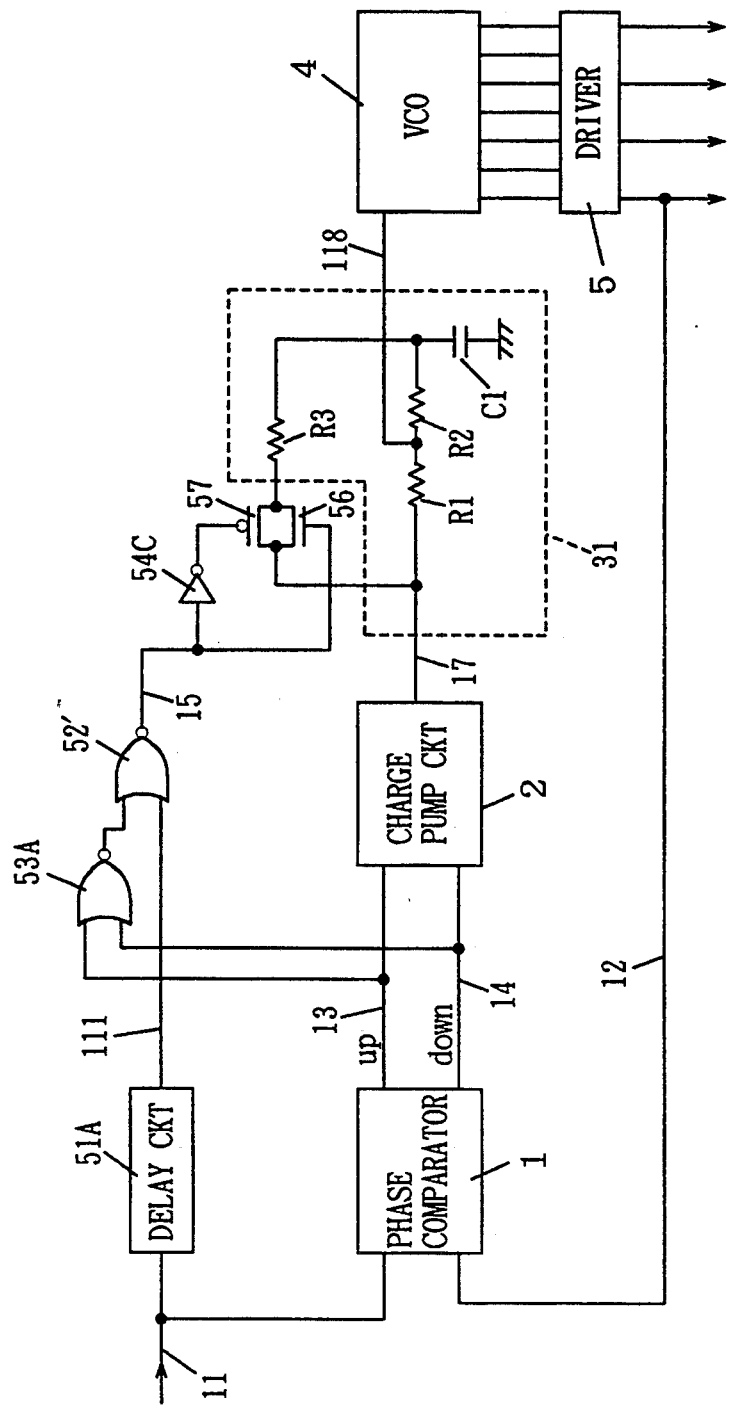
FIG. 6 is a block diagram showing another embodiment of the PLL circuit apparatus of the present invention.

FIG. 6 is a block diagram showing another embodiment of a PLL circuit apparatus in accordance with the present invention.

With reference to FIG. 6, this PLL circuit apparatus includes a delay circuit 51A, NOR circuits 53A and 52', and an inverter circuit 54C. Since other circuits in FIG. 6 are the same as those shown in FIG. 1A, those circuits are denoted by the same reference characters and description thereof will not be repeated here.

The delay circuit 51A delays a reference clock signal 11 by a delay time of an output of a phase comparator 1.

The NOR circuits 53A and 52' each have two input terminals and one output terminal. The NOR circuit 53A has one input terminal connected to receive an up signal 13 and the other input terminal connected to receive a down signal 14. The NOR circuit 52' has one input terminal connected to the output terminal of the NOR circuit 53A, the other input terminal connected to receive an output 111 of the delay circuit 51 and its output terminal connected to an input of the inverter circuit 54C and a gate electrode of the NMOS transistor 56.

Figure 7:
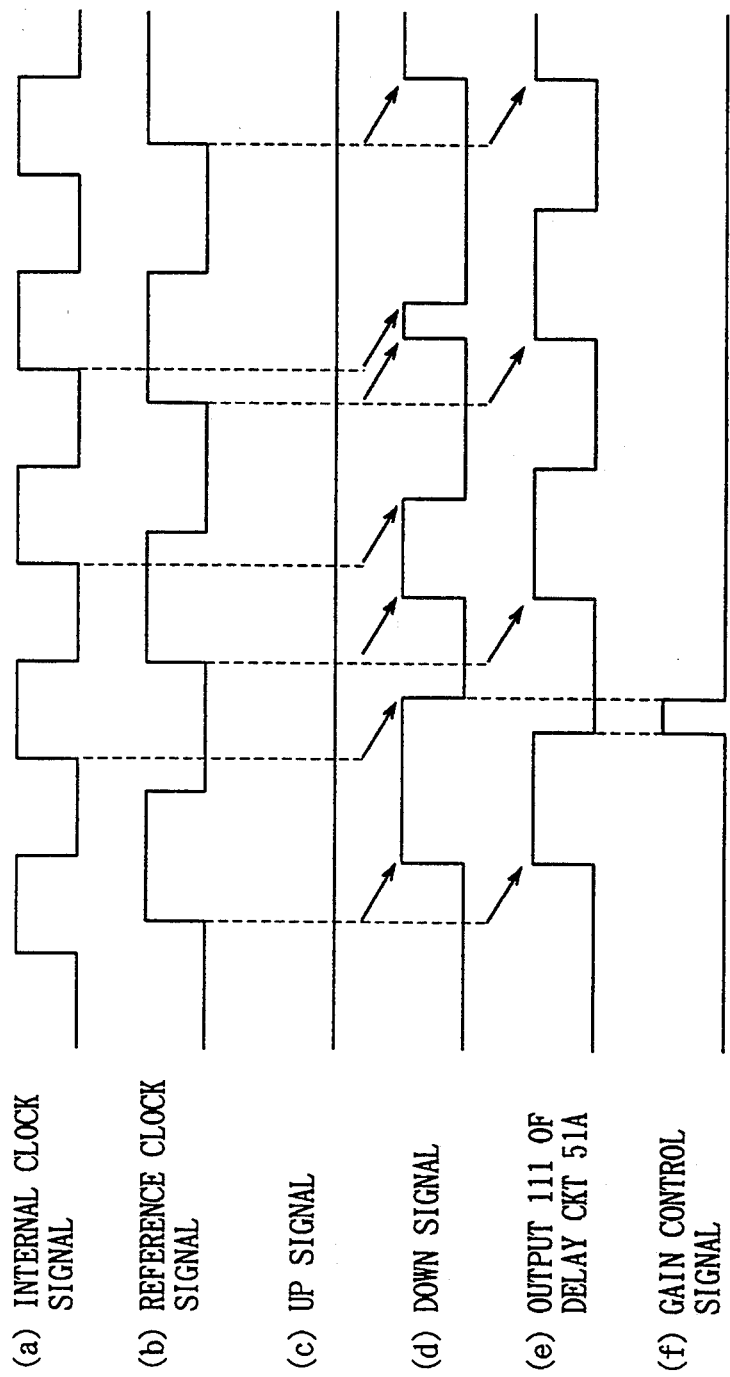
FIG. 7 is a timing chart of the PLL circuit apparatus of FIG. 6.

FIG. 7 is a timing chart of the PLL circuit apparatus shown in FIG. 6 in the case where the internal clock signal 12 is advanced as compared to the reference clock signal 11.

In the case where an internal clock signal 12 is delayed as compared to the reference clock signal 11, the timing chart of the PLL circuit apparatus shown in FIG. 6 will be the same as FIG. 2.

With reference to FIG. 7, (a) represents the waveform of the internal clock signal 12; (b), the waveform of the reference clock signal 11; (c), the waveform of the up signal 13; (d), the waveform of the down signal 14; (e), the waveform of the output signal 111A of the delay circuit 51A; and (f), the waveform of a gain control signal 15 output from the NOR circuit 52'.

The operation of the PLL circuit apparatus shown in FIG. 6 will now be described with reference to FIG. 7.

The reference clock signal 11 is applied to the delay circuit 51A and the phase comparator 1, while the internal clock signal 12 is applied to the phase comparator 1.

A description will now be made on an operation in the case where the internal clock signal 12 is advanced as compared to the reference clock signal 11, with reference to the timing chart of FIG. 7. The phase comparator 1 outputs a pulse corresponding to the difference in rising phase between the reference clock signal 11 and the internal clock signal 12 onto the down signal line and a signal of a logic low level onto the up signal line after an elapse of a certain delay time. The up signal 13 and the down signal 14 are applied to the NOR circuit 53, and the NOR circuit 52' applies a signal in accordance with the logic level of the down signal to the NOR circuit 52'. The NOR circuit 52' takes a logical product of the down signal 14 or the clock signal 111A which is synchronized in phase by delay. Thus, when the pulse width of the reference clock signal is larger than that of the down signal, it can be determined that the phase difference is large. During the period for which the phase difference is large, the gain control signal 15 attains a logic high level. The transfer gate is rendered conductive in response to the gain control signal 15 of the logic high level, so that, as described above, the resistor R3 is connected between the output of the charge pump circuit 2 and the capacitor C1 and the time constant of the loop filter 31 becomes smaller. Accordingly, a path is added through which charges are move from the capacitor C1 via the resistor R3. As a result, the output potential 118 of the loop filter 31 falls more rapidly as compared to the example of the background art.

Figure 8:
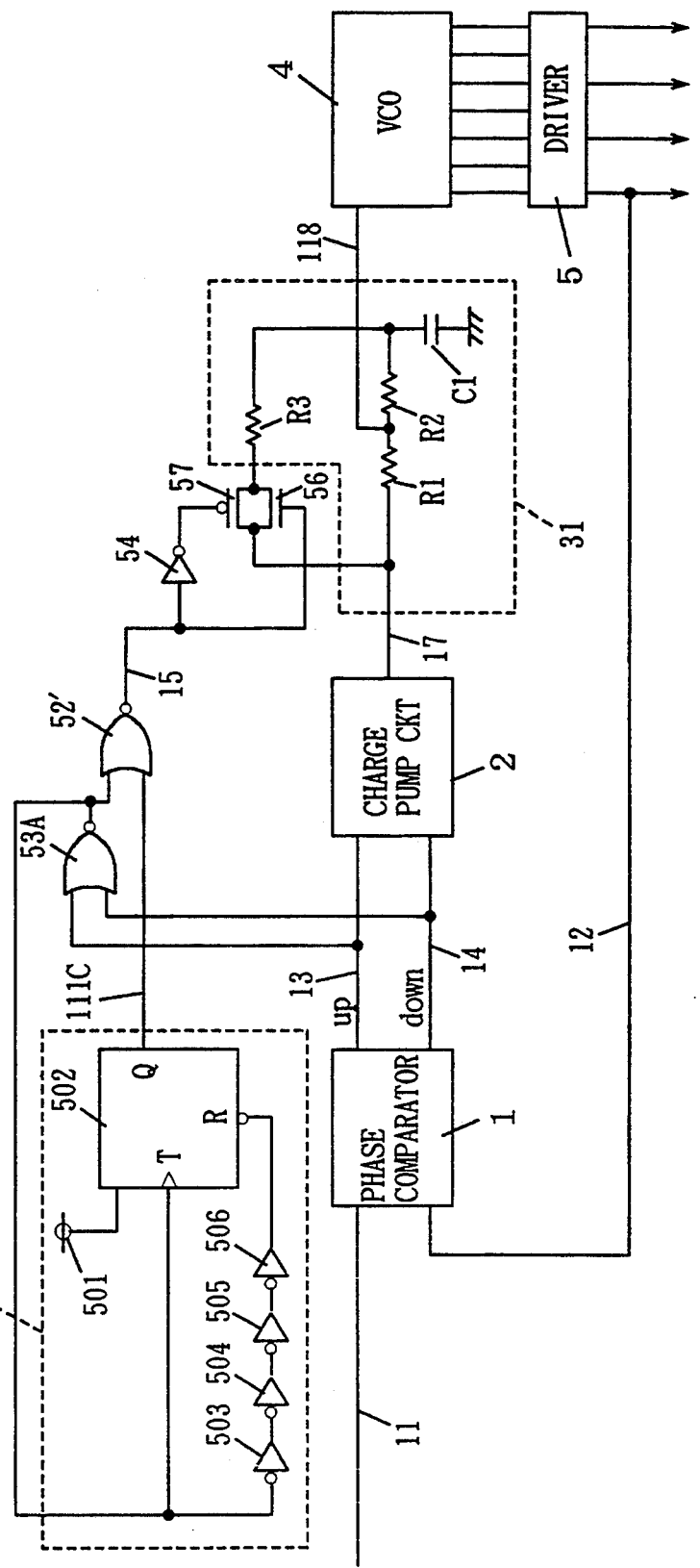
FIG. 8 is a block diagram showing a further embodiment of the PLL circuit apparatus of the present invention.
Figure 9:
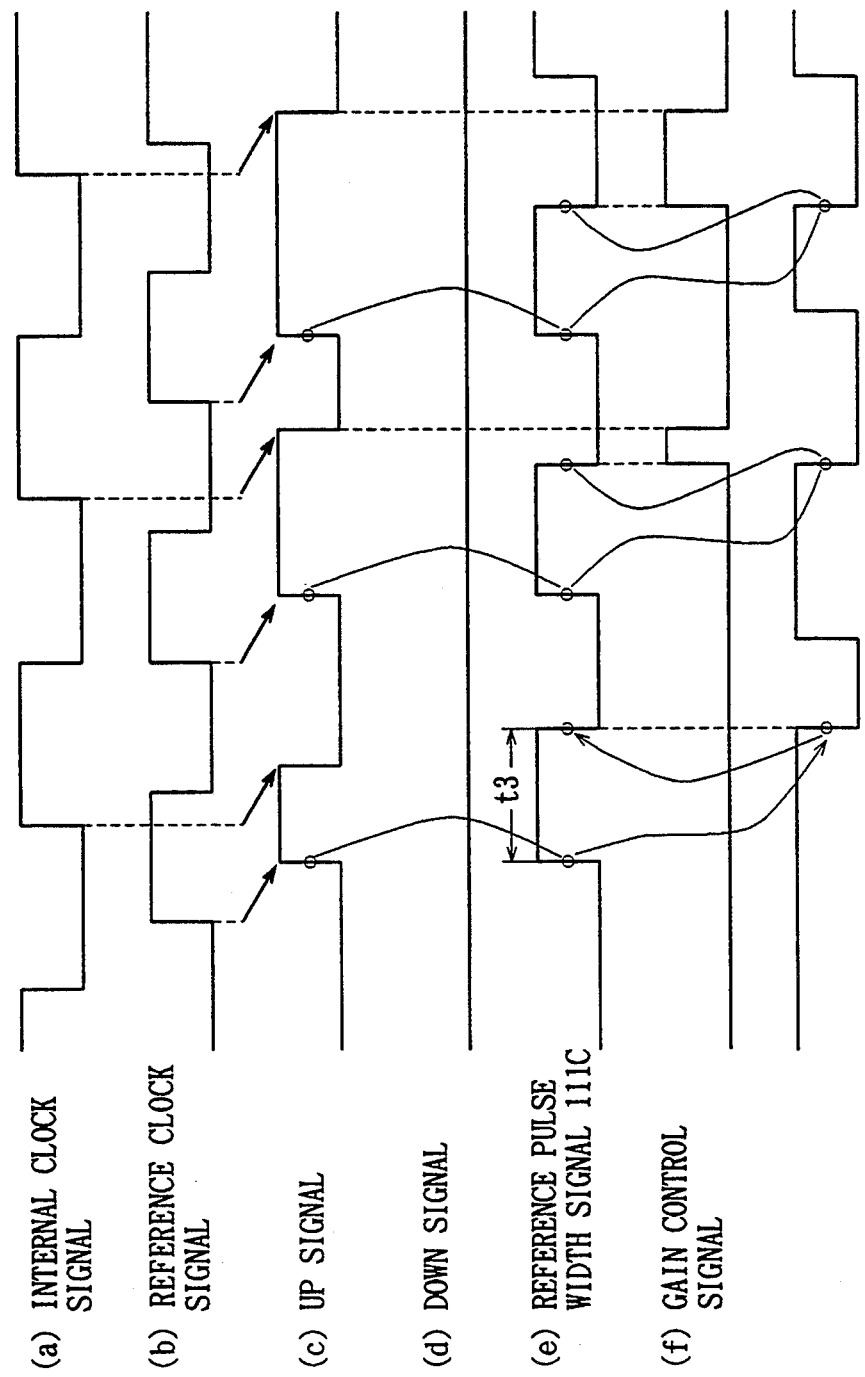
FIG. 9 is a timing chart of the PLL circuit apparatus of FIG. 8.

FIG. 8 is a block diagram showing still another embodiment of the present invention. FIG. 9 is a timing chart of the PLL circuit apparatus shown in FIG. 8. The PLL circuit apparatus shown in FIG. 8 is different from one shown in FIG. 6 in that a reference pulse width signal generator 51c for generating a signal having a reference pulse width is provided in place of the delay circuit 51A.

The reference pulse width signal generator 51C includes a D flipflop 502 having a negative edge trigger terminal T and a reset terminal R and inverter circuits 502 to 506. As described with reference to the embodiment of FIG. 6, the NOR circuit 53A outputs a signal at the "L" level for a time period corresponding to the pulse width corresponding to the phase difference when phase comparison is carried out. D flipflop circuit 502 latches D input (power supply 501) in response to an output from NOR circuit 53A, and outputs a "H" level to output terminal Q. At the same time, the output from NOR circuit 53A is delayed by a prescribed time $t_3$ by the plurality of inverter circuits 503 to 506 to be input to the reset terminal of D flipflop 502. When "L" level is input to the reset terminal, D flipflop 502 maintains the "L" level until the output of the NOR circuit 53A rises next. Consequently, the reference pulse width signal 111C has the pulse width corresponding to the delay time $t_3$.

Figure 10:
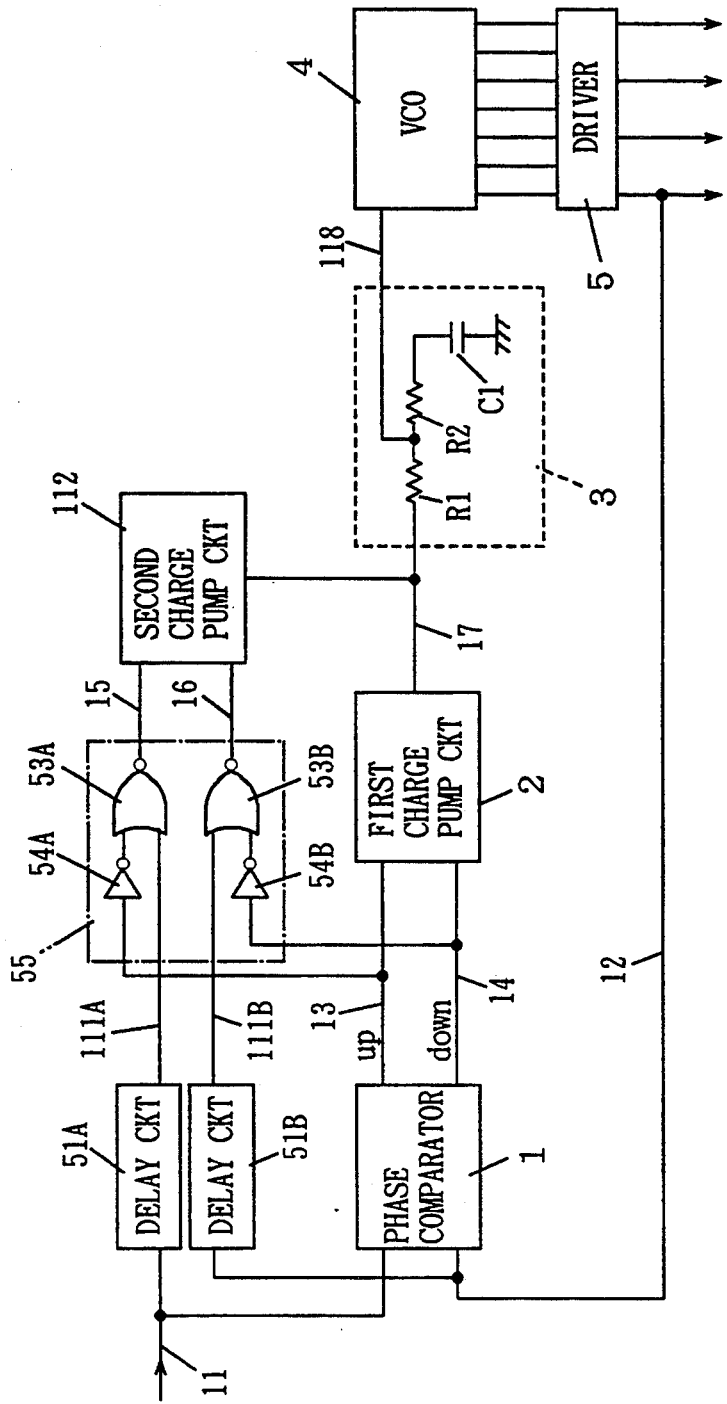
FIG. 10 is a block diagram showing still another embodiment of the PLL circuit apparatus in accordance with the present invention.

FIG. 10 is a block diagram showing another embodiment of the present invention. Differences between the PLL circuit apparatus shown in FIG. 10 and the apparatus shown in FIG. 1A are that a loop filter 3 having one time constant is provided in place of the loop filter 31 having two time constants and that a second charge pump circuit 112 and a signal generating circuit 55 for generating a second up signal and a second down signal are provided. Since the other circuits of FIG. 10 are identical to those of FIG. 1A, they are denoted with the same reference characters and a description thereof will not be repeated here.

The signal generating circuit 55 includes NOR circuits 53A and 53B, and inverter circuits 54A and 54B. A clock signal 111A delayed by a delay circuit 51A is applied to one input terminal of the NOR circuit 53A and a signal inverted from the up signal 13 is applied to the other input terminal of the NOR circuit 53A. A clock signal 111B delayed by a delay circuit 51B is applied to one input terminal of NOR circuit 53B and a signal inverted from the down signal 14 is applied to the other input terminal of the NOR circuit 53B. A second up signal 15 which is obtained by taking a logical product of the up signal 13 and the clock signal 111A is output from an output terminal of the NOR circuit 53A, while a second down signal 16 which is obtained by taking a logical product of the down signal 14 and the clock signal 111B is output from an output terminal of the NOR circuit 53B. That is, the signal generating circuit 55 detects whether the pulse width of the up signal 13 or down signal 14 is larger than that of the reference clock signal 11. If the pulse width of the up signal 13 or down signal 14 is larger than that of the reference clock signal 11, the signal generating circuit 55 generates the second up signal 15 and the second down signal 16 to operate the second charge pump circuit 112.

In the embodiment shown in FIG. 6, the operation for comparing the pulse width of the up signal 13 or down signal 14 from the phase comparator 1 with the pulse width of the reference clock signal 11 is approximately the same as the operation described in FIGS. 2-5. However, the operation in FIG. 10 is different in the following point from the one in FIG. 2. That is, after the rising phase of the reference clock signal 11 is made approximately identical to that of the up signal 13 by the delay circuit 51, the gain control signal 15 or 16, which attains a logic high level only when the up signal 13 is at a logic high level and the output 111 of the delay circuit 51A is at a logic low level, is output to the second charge pump circuit 112.

Alternatively, after the rising phase of internal clock signal 12 is made approximately identical to that of the down signal 14 by the delay circuit 53B, the gain control signal 16 which attains a logic high level only when the down signal 14 is at a logic high level and the output 111B of the delay circuit 51B is a logic low level, is output to the second charge pump.

The second charge pump circuit 112 receives the output gain control signal 15 or 16 to apply charges to the loop filter 3, together with the first charge pump circuit 2.

Accordingly, when the phase difference between the internal clock signal 12 and the reference clock signal 11 is larger than the pulse width of the reference clock signal 11, it is detected that the phase difference is large, and the second charge pump circuit 102 operates. Therefore, the output potential 118 of the loop filter 3 changes more rapidly than in the background art example. However, when the phase difference between the internal clock signal 12 and the reference clock signal 11 is smaller than the pulse width of the reference clock signal 11, it is detected that the phase difference is small, and the second charge pump circuit 102 does not operate. Therefore, the output potential 118 of the loop filter 3 changes at the same speed as in the background art example.

Thus, according to the embodiment of FIG. 10, it is possible to shorten the synchronization pull-in time without increasing the phase change of the internal clock signal in synchronization, similarly to the embodiment of FIG. 1A.

Figure 11:
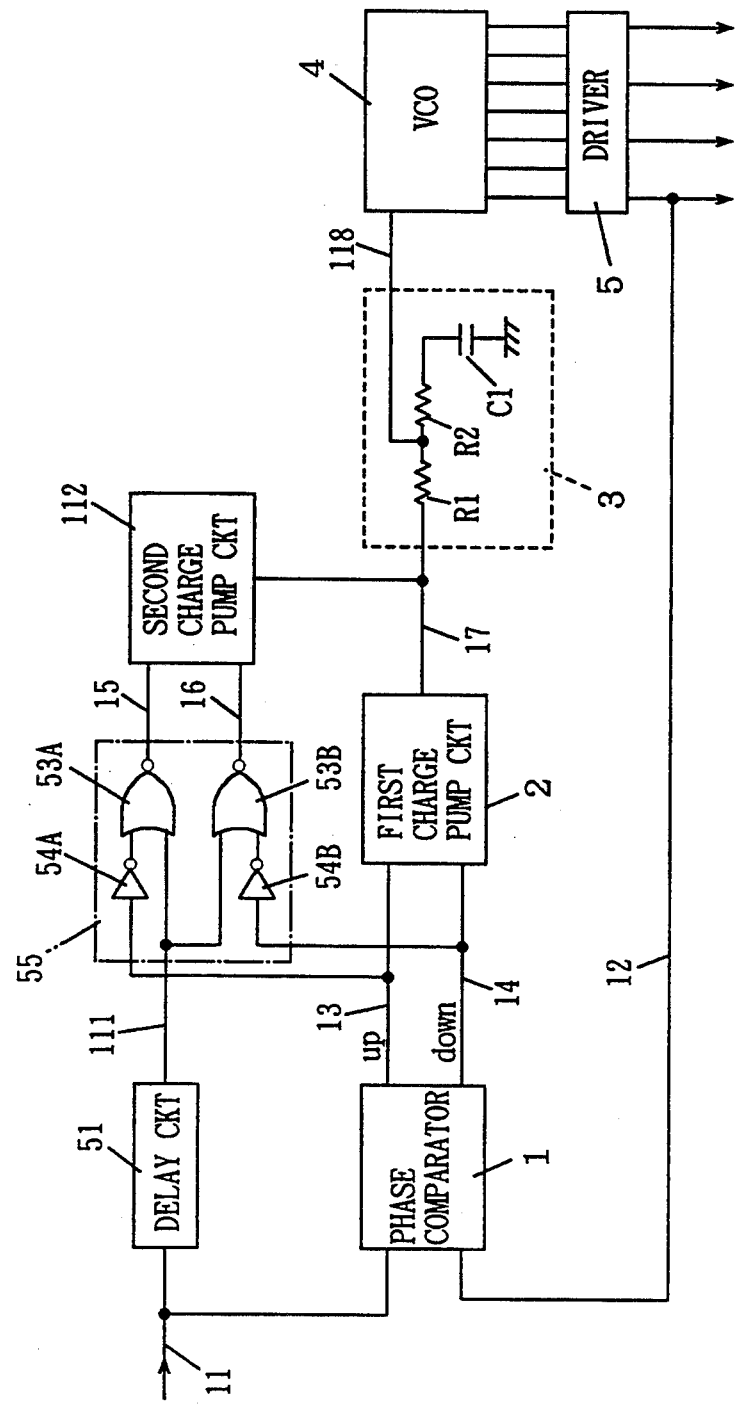
FIG. 11 is a block diagram showing a still further embodiment of the PLL circuit apparatus in accordance with the present invention.

While the reference clock signal 11 and internal clock signal 12 are employed in detection of the magnitude of the phase difference in the PLL circuit apparatuses shown in FIGS. 1A and 10, either reference clock signal 11 or, the internal clock signal 12 may be employed. FIG. 11 is a block diagram showing an example in which the above described reference clock signal only is used for detecting the magnitude of the phase difference.

Further, the delay circuit 51A and 51B may be a latch circuit which receives and outputs an up signal or a down signal. Moreover, the outputs 111A and 111B of the delay circuits 51A and 51B may be set so that its rising phase is output slightly more rapidly as compared to the up signal 13 or down signal 14.

Figure 12:
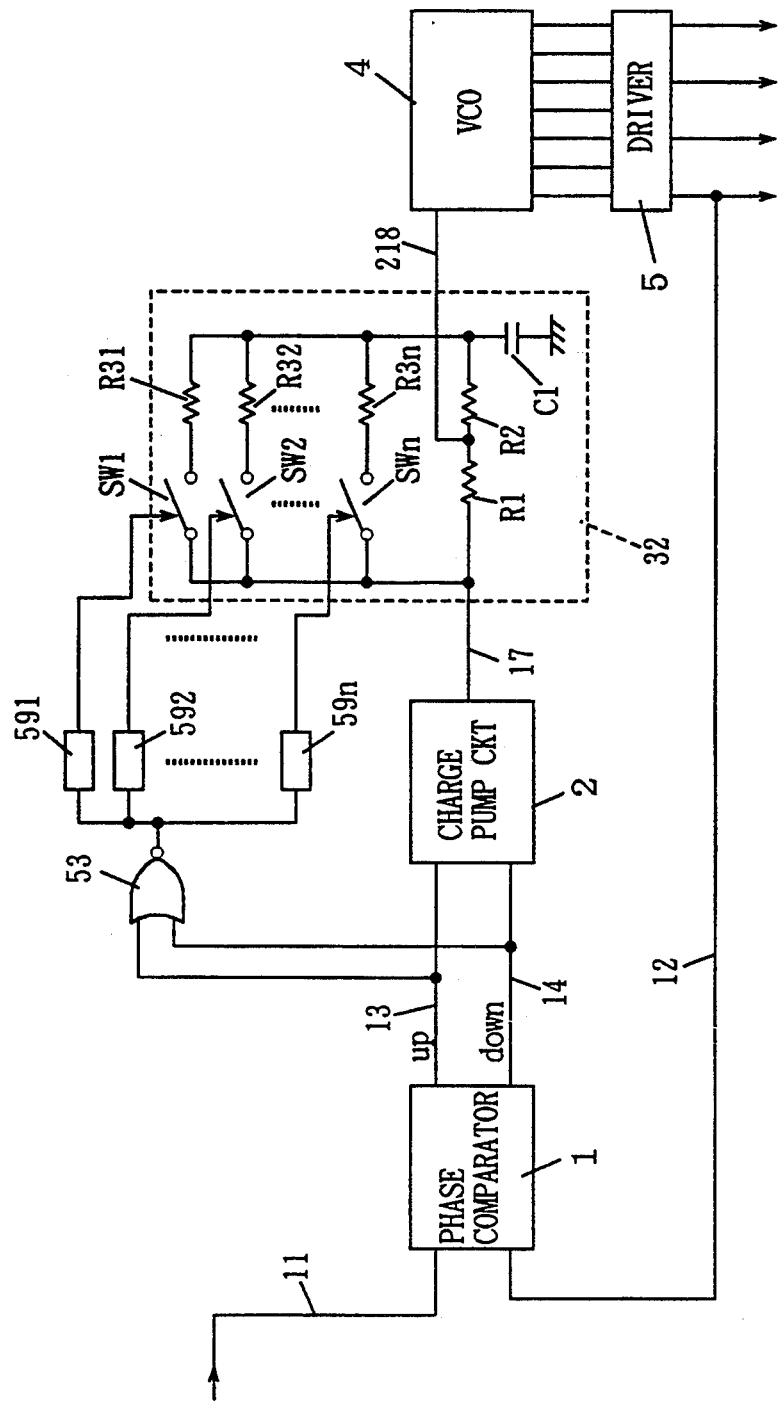
FIG. 12 is a block diagram showing a still further embodiment of the PLL circuit apparatus in accordance with the present invention.

FIG. 12 is a block diagram showing a still further embodiment of the present invention. A PLL circuit apparatus shown in FIG. 12 includes, in place of the delay circuits 51A and 51B, a plurality of phase difference determining circuits 591-59n for determining largeness of phase differences, and a loop filter 32 having a plurality of time constants. The loop filter 32 includes switch circuits SW1-SWn provided corresponding to the plurality of phase difference determining circuits 591-59n, and a plurality of resistors R31-R3n. Each of the phase difference determining circuits 591-59n detects magnitude of a pulse width of an up signal 13 or a down signal 14. The switch circuits SW1-SWn are turned on in response to that detection signal, so as to connect the resistors R31-R3n between an output terminal of a charge pump circuit 2 and a capacitor C1. This changes a time constant of the loop filter 32, and an output potential 218 of the loop filter 32 can be increased as the phase difference between a reference clock signal 11 and an internal clock signal 12 becomes increased.

Figure 13:
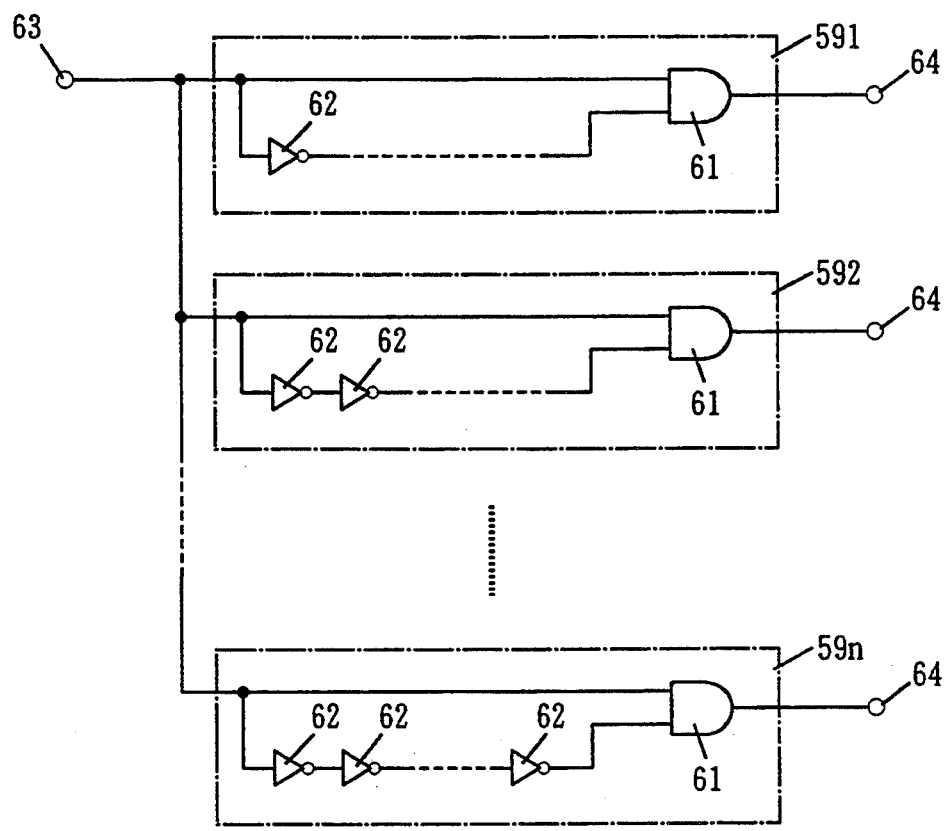
FIG. 13 is a circuit diagram showing a phase difference determining circuit shown in FIG. 12.

FIG. 13 is a schematic diagram of the phase difference determining circuits 591-59n shown in FIG. 12. With reference to FIG. 13, each of the phase difference determining circuits 591-59n includes an AND circuit 61 and an even number of inverters 62 for setting a delay time. A reference numeral 63 denotes an output of a NOR circuit 53, and 64 denotes an output of each phase difference determining circuit.

In operation, a pulse 63 output from the NOR circuit 53 is output with a delay time which is preset by the inverter circuit 62. If the AND circuit 61 takes a logical product of the output pulse 63 from the NOR circuit 53 and the pulse delayed by the inverter 62, then a pulse of a time width delayed by the plurality of inverters is output. When the pulse width of the signal output from the NOR circuit 53 is smaller than the delay time set by the plurality of inverters 62, a signal of a logic low level is output from the phase difference determining circuit.

If the delay times of the phase difference determining circuits 591-59n of FIG. 12 are set sequentially to larger values, then the number of phase difference determining circuits for outputting pulses becomes increased as the pulse width of the up signal 13 or down signal 14 becomes larger. When the phase difference determining circuits 591-59n output pulses, the switch circuits SW1-SWn are rendered conductive so as to connect the resistors R31-R3n in parallel with the resistors R1 and R2. Accordingly, the time constant of the loop filter 32 becomes smaller.

As a result, in the embodiment shown in FIG. 12, as the phase difference between the internal clock signal 12 and the reference clock signal 11 increases, the pulse width of the up signal 13 or down signal 14 becomes increased and the number of phase difference determining circuits for outputting a pulse signal becomes increased. Also, the number of resistors R31-R3n connected in parallel with the resistors R1 and R2 of the loop filter 32 becomes increased. Accordingly, the time constant of the loop filter 32 is decreased and the output potential 218 of the loop filter 32 rapidly changes corresponding to the phase difference, whereby the synchronization pull-in time of the PLL circuit apparatus is shortened.

Conversely, if the phase difference becomes smaller, the time constant of the loop filter 32 does not decrease, and hence, the output potential 218 of the loop filter 32 changes slower corresponding to the phase difference. Thus, the stability of the internal clock signal 12 in a synchronization state can be maintained.

Figure 14:
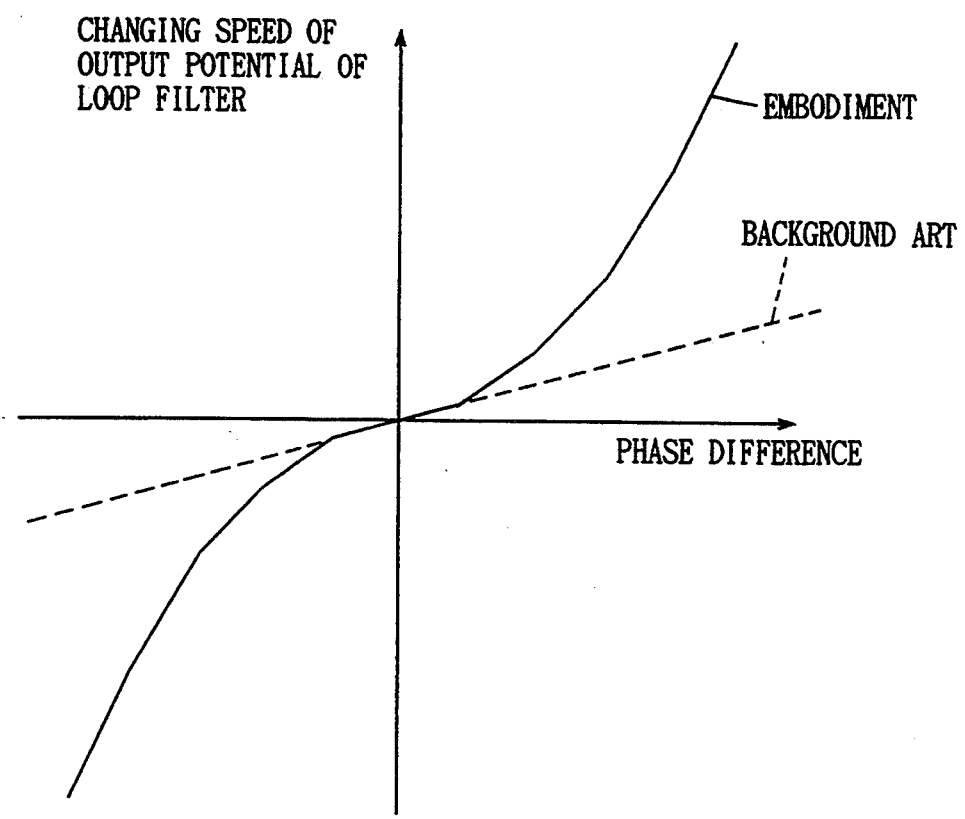
FIG. 14 is a graph showing a relationship between a speed of changes of an output potential of a loop filter shown in FIGS. 12 and 13 and a phase difference between a reference clock signal and an internal clock signal.

A description will now be given on the relationship between changing speed of the output potential 218 of the loop filter 32 in the PLL circuit apparatus shown in FIGS. 12 and 13 and the phase difference between the reference clock signal 11 and the internal clock signal 12, with reference to FIG. 14. Referring to FIG. 14, the broken line represents the background art example, and the solid line represents this embodiment. In the background art example, since there is no change in the time constant of the loop filter 3, the changing speed of the output potential 18 of the loop filter 3 is constant with respect to the phase difference. On the other hand, in this embodiment, since the time constant of the loop filter 32 decreases with an increase in phase difference, the changing speed of the output potential 218 of the loop filter 32 becomes higher with respect to the phase difference.

In the embodiment shown in FIGS. 12 and 13, the resistors R31-R3n need not have the same resistance value but may have different values. Alternatively, in the embodiment of FIG. 12, such a circuit configuration may be applied that the resistance values of the resistors R31-R3n are set to be different values instead of changing the number of resistors R31-R3n to be connected, an encoding circuit is interposed between the phase difference determining circuits 591-59n and the switching circuits SW1-SWn, and any one of the resistors is connected in accordance with a phase difference.

Alternatively, a combination of the above circuit configuration example and the embodiment of FIG. 12 may be applied.

Alternatively, a combination of the circuit configurations of the embodiments shown in FIGS. 1A, 10 and 12 may be applied.

Further, since it is desirable that the time constants can be changed, capacitances may be changed instead of resistance values.

Figure 15:
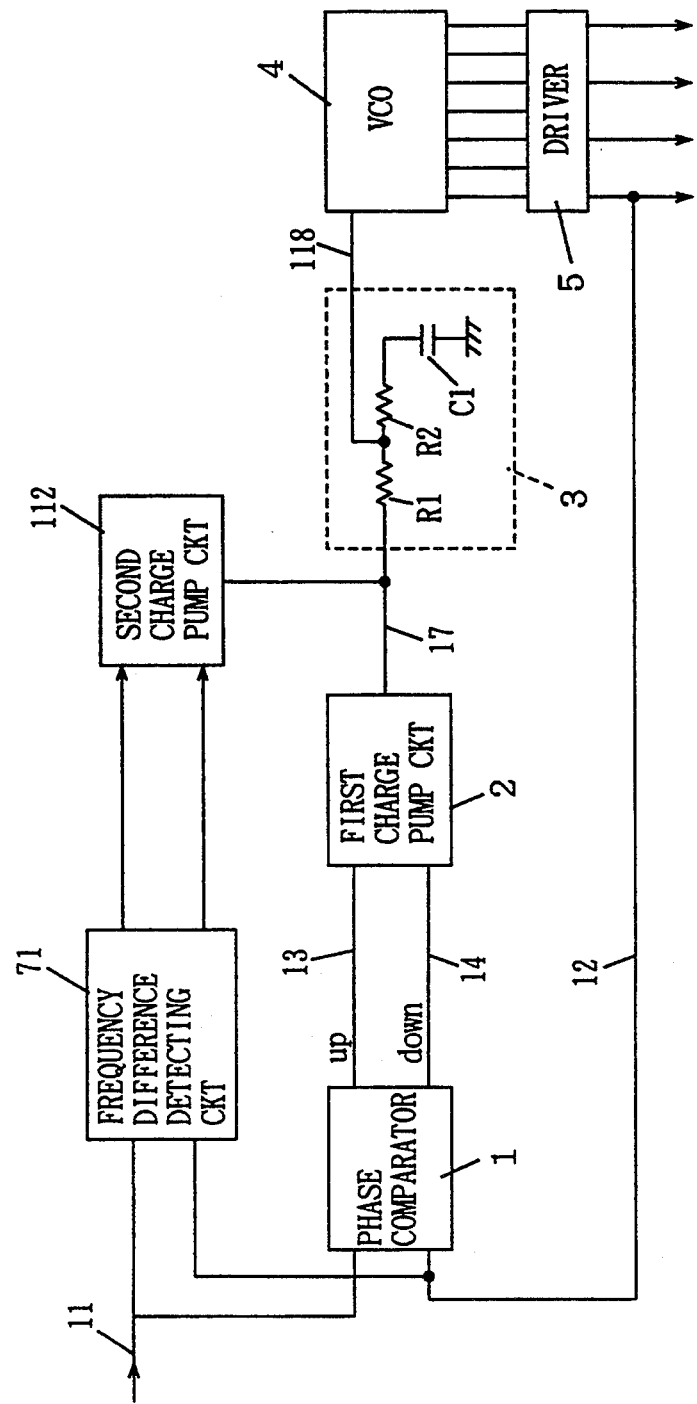
FIG. 15 is a block diagram showing a still further embodiment of the PLL circuit apparatus in accordance with the present invention.

FIG. 15 is a block diagram showing still another embodiment of the present invention. With reference to FIG. 15, the difference between this PLL circuit apparatus and the one shown in FIG. 1A is that a frequency difference detecting circuit 71 is provided in place of the delay circuits 51A and 51B. This frequency difference detecting circuit 71 generates a second up signal when the cycle of an internal clock signal 12 is two or more times the cycle of a reference clock signal 11, while the circuit 71 generates a second down signal when the cycle of the internal clock signal 12 is a half or less the cycle of the reference clock signal 11.

Figure 16:
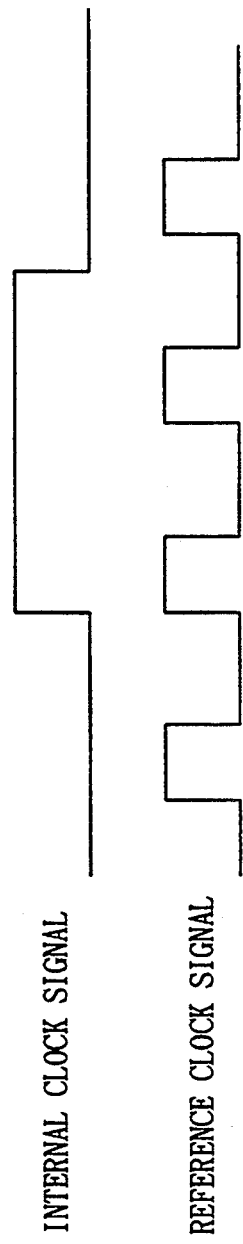
FIG. 16 is a diagram showing a relationship between the frequency of the internal clock signal and that of the reference clock signal when a second up signal is generated in FIG. 15.

FIG. 16 is a timing chart showing the relationship between the frequency of the internal clock signal and that of the reference clock signal when the frequency difference detecting circuit 71 shown in FIG. 15 generates the second up signal.

Figure 17:
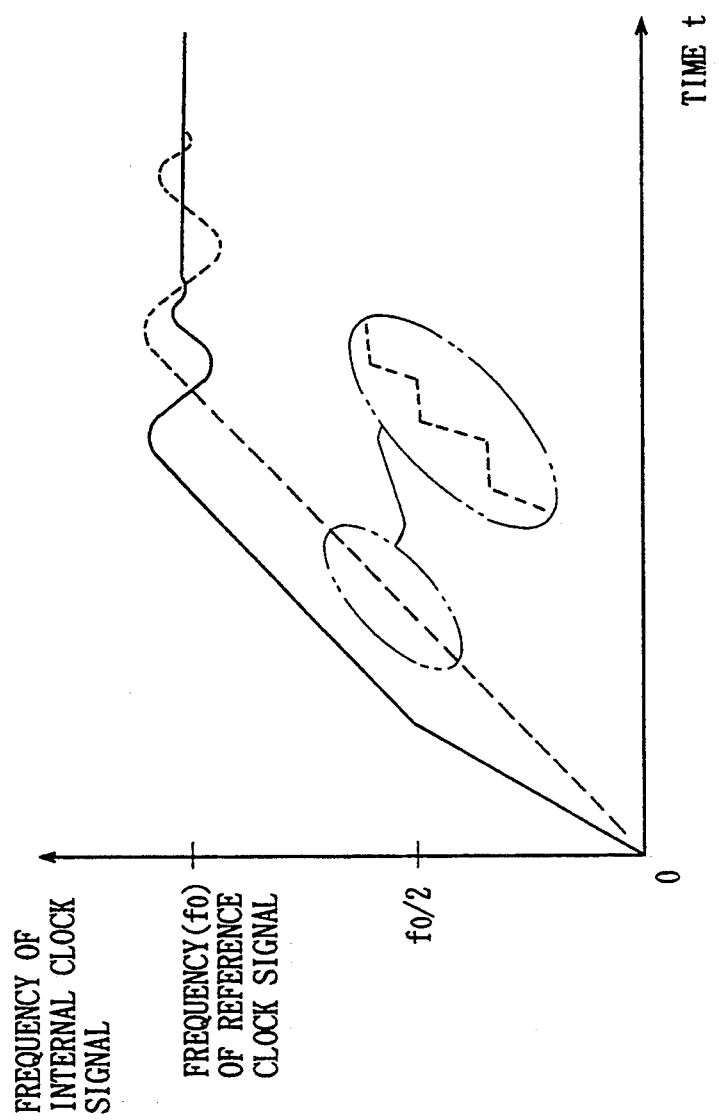
FIG. 17 is a diagram showing the frequency of the internal clock signal in the PLL circuit apparatus shown in FIG. 15 and the frequency of the internal clock signal in the background art example.

FIG. 17 is a diagram showing the frequency of the internal clock signal of the PLL circuit apparatus shown in FIG. 15 and the frequency of the internal clock signal in the background art example. The solid line in FIG. 17 represents this embodiment, and the broken line represents the background art example. In this embodiment, the internal clock signal 12 is more rapidly drawn into a synchronization state as compared to the background art example until the frequency of the internal clock signal 12 becomes a half of the frequency of the reference clock signal 11. In addition, unlike the case with phase synchronization, the frequency of the internal clock signal 12 becomes close to that of the reference clock signal 11 in a linear manner.

Figure 18:
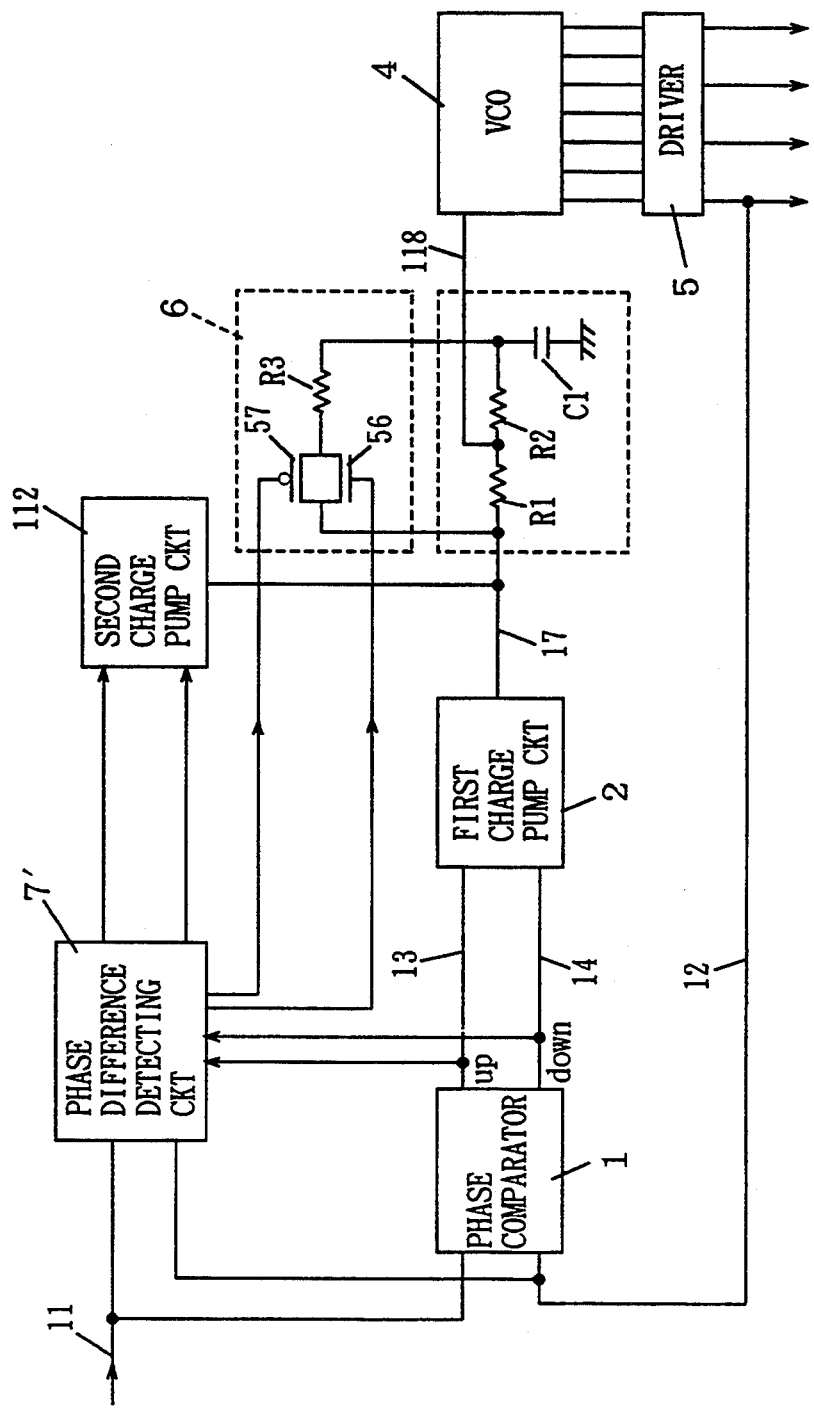
FIG. 18 is a block diagram showing a still further embodiment of the PLL circuit apparatus in accordance with the present invention.

FIG. 18 is a block diagram showing a still further embodiment of the PLL circuit apparatus in accordance with the present invention. With reference to FIG. 18, this PLL circuit apparatus is different from that shown in FIG. 15 in that a phase detecting circuit 7' is provided in place of the frequency difference detecting circuit 71 and that a loop filter having two stages of gains is provided. The phase difference detecting circuit 7' outputs a gain control signal to the gain control circuit 6. This gain control signal is output from the control signal generating portions 44A and 44B described later. A signal output from the phase difference detecting circuit 7' to a second charge pump circuit is an output of the contention preventing portion 46 described later.

In operation, the second charge pump circuit 112 is driven in response to the gain control signal output from the control signal generating portions 44A and 44B of the phase difference detecting circuit 7', and the gain of the loop filter is changed in response to the gain control signal output from the contention preventing portion 46 of the phase difference detecting circuit 7'. This enables a substantial reduction in the full-in time of the PLL circuit apparatus.

Figure 19A:
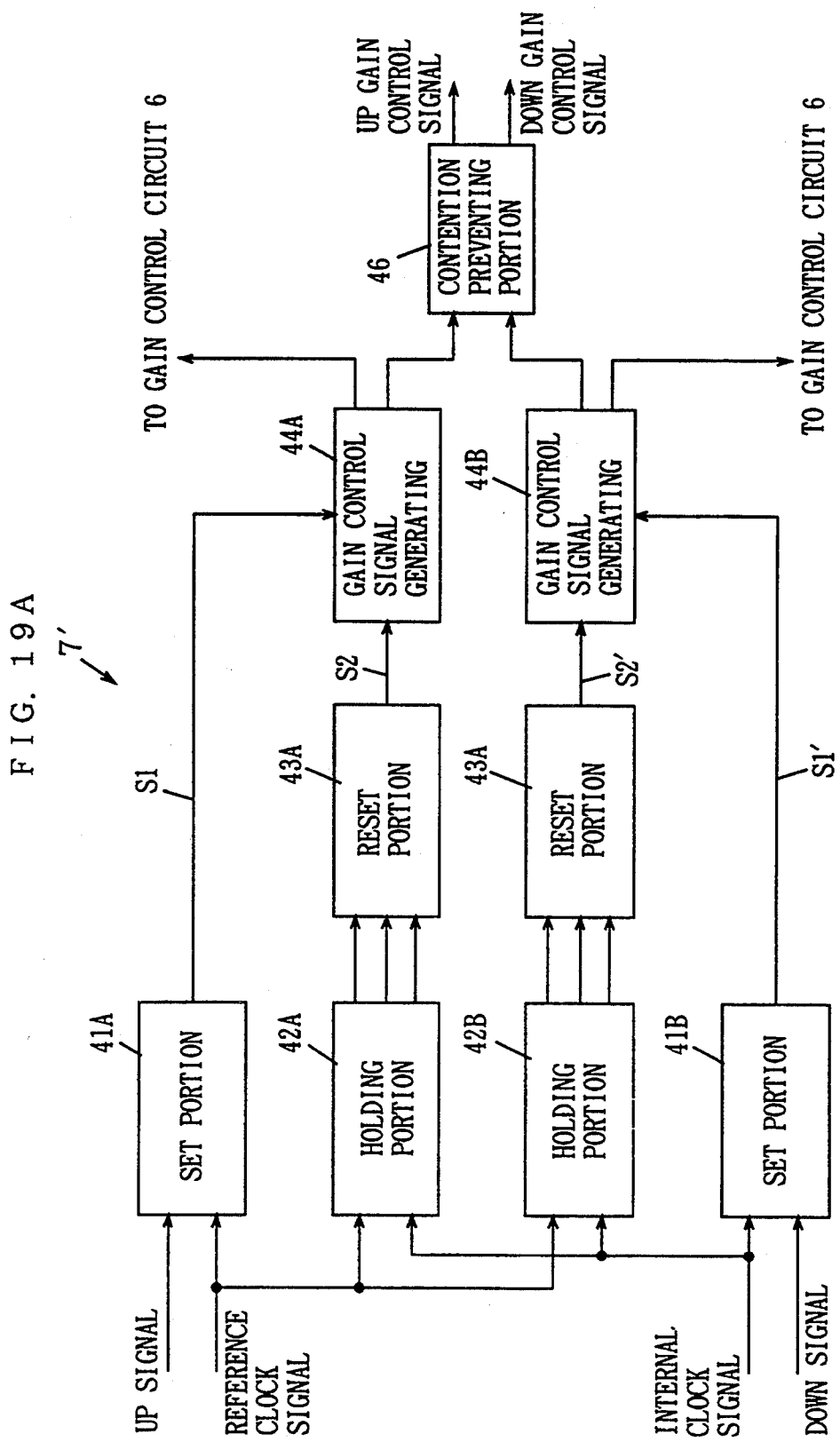
FIG. 19A is a block diagram showing a phase difference detecting circuit 7' shown in FIG. 18.
Figure 19B:
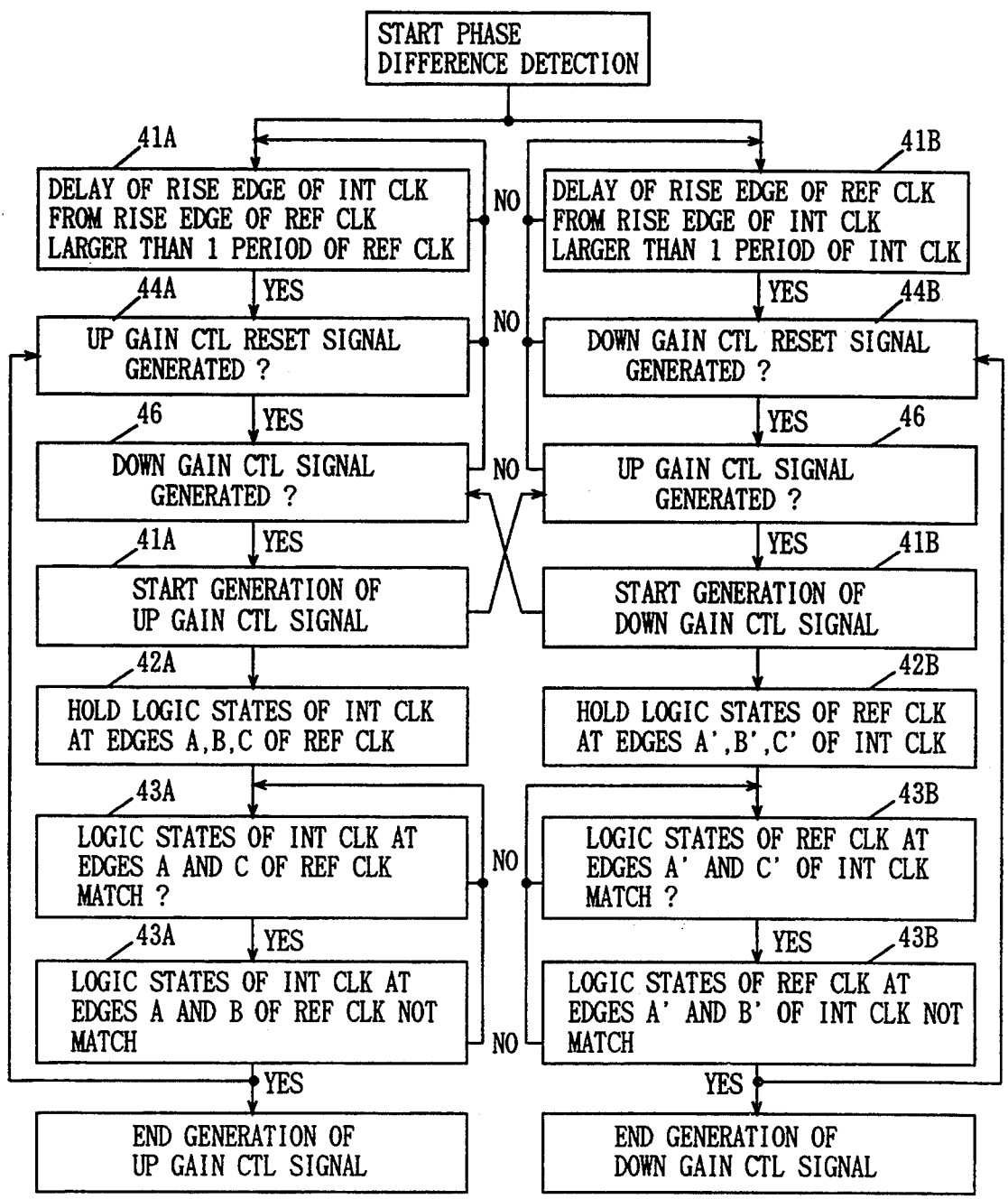
FIG. 19B is a flow chart showing the operation of a phase difference detecting circuit 7' shown in FIG. 19A

FIG. 19A is a block diagram showing a phase difference detecting circuit 7' shown in FIG. 18. FIG. 19B is a flow chart showing the operation of a phase difference detecting circuit 7' shown in FIG. 19A. FIG. 19C is a timing chart showing the input timing of the reference clock signal and internal clock signal. The phase difference detecting circuit 7' shown in FIG. 19A includes a gain control signal generating portion 44A for generating an up gain control signal, a gain control signal generating portion 44B for generating a down gain control signal, set portions 41A and 41B, holding portions 42A and 42B, reset portions 43A and 43B, and a contention preventing portion 46. In the operation, the set portion 41A generates a set signal S1 for setting the gain control signal generating portion 44A when a phase difference between a rising edge of a reference clock signal and a rising edge of an internal clock signal is longer than one period length of the reference clock signal. The set portion 41B generates a set signal S1' for setting the gain control signal generating portion 44B. When a phase difference between a rising edge of an internal clock signal and a rising edge of a reference clock signal is larger than one period length of the internal clock signal. By the signal S1 or S1', the gain control signal generating portion 44A or 44B is set, and a gain control signal is output from the contention preventing portion 46, and therefore the phase between the reference clock signal and the internal clock signal is rapidly become closed to each other. The phases coming close to each other are detected by the holding portions 42A and 42B as well as the reset portions 43A and 43B in the following manner. The holding portion 42A holds logic states of an internal clock signal at three edges A, B, C shown in FIG. 19 (C) in total including two rising edges A, B and one falling edge B of a reference clock signal. The holding portion 42B holds logic states of the reference clock signal at three edges A', B', C' shown in FIG. 19 (C) in total including two rising edges A', C' and one falling edge B' of the internal clock signal. The reset portion 43A determines from the logic state of the internal clock signal held by the holding portion 42A, as to whether a ½ period length of the internal clock signal is in the range of a ½ period length to one period length of the reference clock signal. If the result of determination is YES, then the reset portion 43A outputs a reset signal S2 to the gain control signal generating portion 44A. The reset portion 43B determines from the logic state of the reference clock signal held by the holding portion 42B, as to whether the ½ period length of the reference clock signal is in the range of the ½ period length to one period length of the internal clock signal. If the result of determination is YES, then the reset portion 43B outputs a reset signal S2' to the gain control signal generating portion 44B. The contention preventing portion 46 prevents a simultaneous output of the up gain control signal and the down gain control signal.

Figure 20:
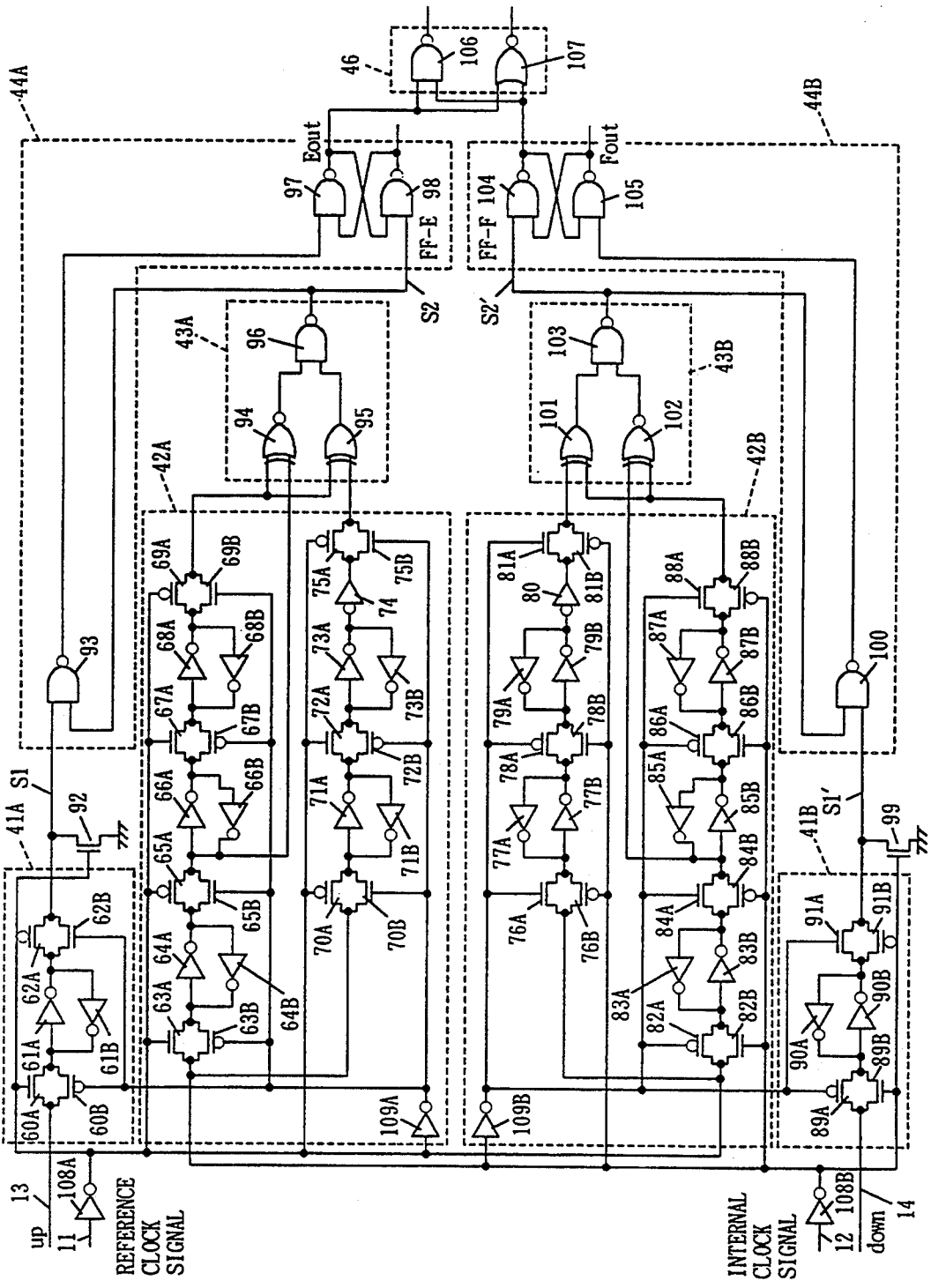
FIG. 20 is a schematic diagram showing a phase difference detecting circuit 7' shown in FIG. 19A.

FIG. 20 is a circuit diagram showing a phase difference detecting circuit shown in FIG. 19A.

Each circuit shown in FIG. 20 will now be described in detail. The gain control signal generating portion 44A includes a NAND gate 93 for taking a logical product of an output of the set portion 41A and an output of the reset portion 43A, and NAND gates 97 and 98 for constituting an RS flipflop.

The set portion 41A includes an NMOS transistor 60A and a PMOS transistor 60B constituting a transmission gate for an input, inverters 61A and 61B constituting a latch circuit, and a PMOS transistor 62A and an NMOS transistor 62B constituting a transmission gate for an output. The input transmission gate responds to a reference clock signal to input an up signal to the latch circuit. The output transmission gate responds to a rising of a reference clock signal at the next cycle to output a signal held in the latch circuit as the set signal S1. An NMOS transistor 92 provided between the set portion 41A and the gain control signal generating portion 44A responds to a reference clock signal input via an inverter 108A to set an output of the set portion 41A at a low level.

The holding portion 42A includes a 3-stage shift register and a 2-stage shift register. The 3-stage shift register includes NMOS transistors 63A, 65B, 67A and 69B, PMOS transistors 63B, 65A, 67B and 69A, and inverters 64A, 64B, 66A, 66B, 68A and 68B. The 2-stage shift register includes NMOS transistors 70B, 72A and 81A, PMOS transistors 70A, 72B and 75A, and inverters 71A, 71B, 73A, 73B and 74. A clock signal applied to the 3-stage shift register is made opposite in phase to a clock signal applied to the 2-stage shift register. The logic state of an internal clock signal is held by first and third stages of the 3-stage shift register, and the logic state of the internal clock signal is held by a second stage of the 2-stage shift register.

The reset portion 43A includes an EX-NOR gate 94, an EX-OR gate 95 and a NAND gate 96. The EX-NOR gate 94 takes EX-NOR of an output of the inverter 68A at the third stage of the 3-stage shift register and an output of the inverter 64A at the first stage of the 3-stage shift register. The EX-OR gate 95 takes EX-OR of the output of the inverter 68A and an output of the inverter 94 of the 2-stage shift register. The NAND gate 96 takes a logical sum of an output of the EX-NOR gate 94 and an output of the EX-OR gate 95 and applies a signal of the logical sum as a reset signal S2 to the control signal generating portion 44A.

The control signal generating portion 44B includes a NAND gate 100 for taking a logical product of an output of the set portion 41B and an output of the reset portion 43A, and NAND gates 104 and 105 constituting an RS flipflop.

The set portion 41B includes an NMOS transistor 89A and a PMOS transistor 89B constituting a transmission gate for an input, inverters 90A and 90B constituting a latch circuit, and a PMOS transistor 91A and an NMOS transistor 91B constituting a transmission gate for an output.

An NMOS transistor 97 provided between the set portion 41B and the gain control signal generating portion 44B response to an internal clock signal input via an inverter 108B to set an output of the set portion 41B at a low level.

The holding portion 42B includes a 3-stage shift register and a 2-stage shift register. The 3-stage shift register includes NMOS transistors 82B, 84A, 86B and 88A, PMOS transistors 82A, 84B, 86A and 88B, and inverters 83A, 83B, 85A, 85B, 87A and 87B. The stage shift register includes NMOS transistors 76A, 78B and 81A, PMOS transistors 76B, 78A and 81B, and inverters 77A, 77B, 79A, 79B and 80. The logic state of a reference clock signal is held by first and third stages of the 3-stage shift register, and the logic state of the reference clock signal is held by a second stage of the 2-stage shift register.

The reset portion 43B includes an EX-NOR gate 102, an EX-OR gate 101 and a NAND gate 103. The reset portion 43B 15 is operative similarly to the above-described reset portion 43A to apply a reset signal S2' to the control signal generating portion 44B.

The contention preventing portion 46 includes a NAND gate 106 and a NOR gate 107. Each of the NAND gate 106 and the NOR gate 107 receives a gain control signal generated by the gain control signal generating portions 44A and 44B.

A description will now be made on an operation of the phase difference detecting circuit apparatus of FIG. 13 with reference to FIGS. 14, 15 and 16.

Figure 21:
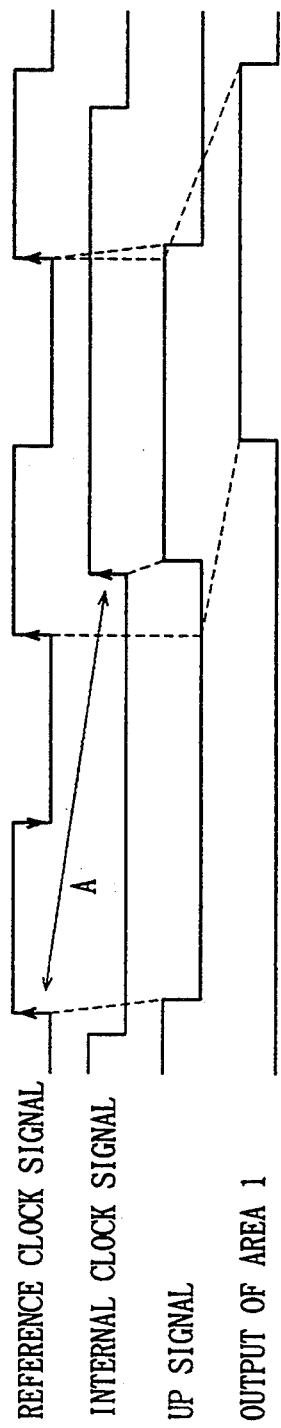
FIG. 21 is a timing chart showing an input/output of a set portion 41A.
Figure 22:
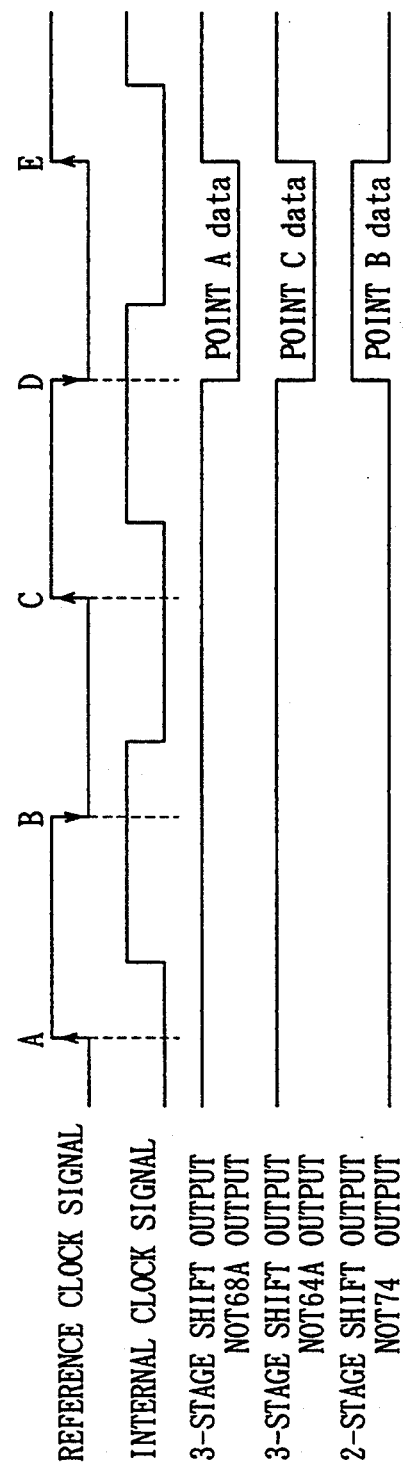
FIG. 22 is a timing chart showing an input/output of a holding portion 42A.
Figure 23:
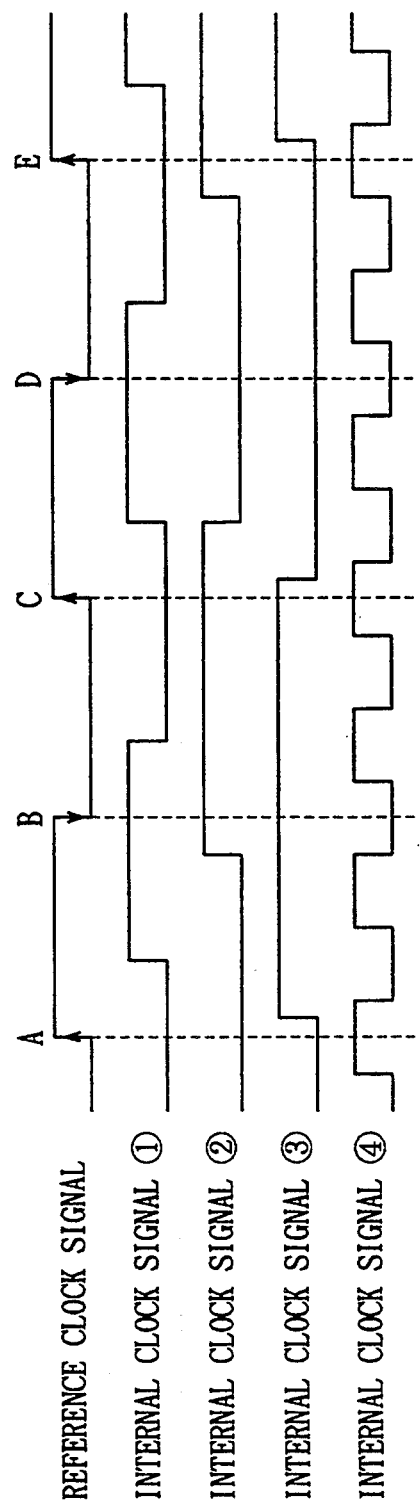
FIG. 23 is a timing chart showing an example of determination in a reset portion 43A.
Figure 25:
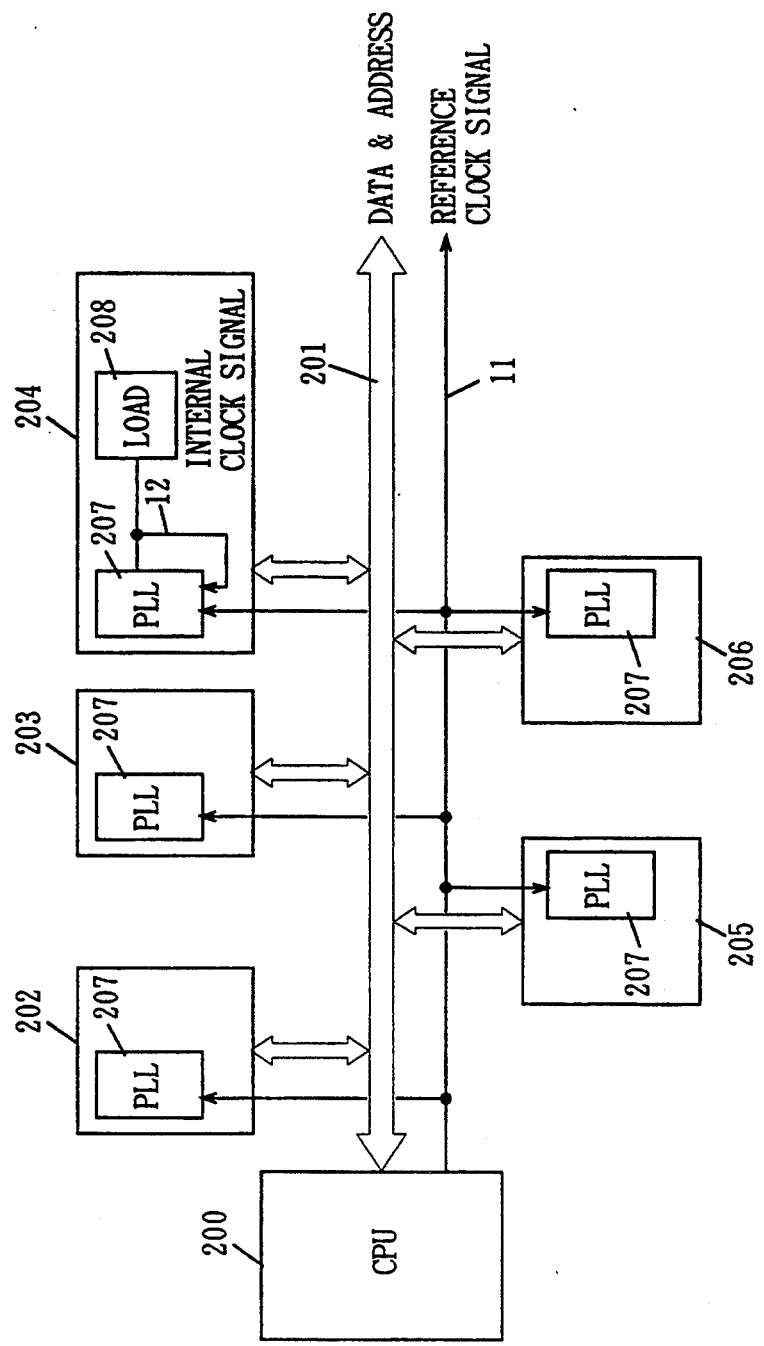
FIG. 25 is a block diagram of a system in which PLL circuit apparatuses are each distributed to LSIs.
Figure 26:
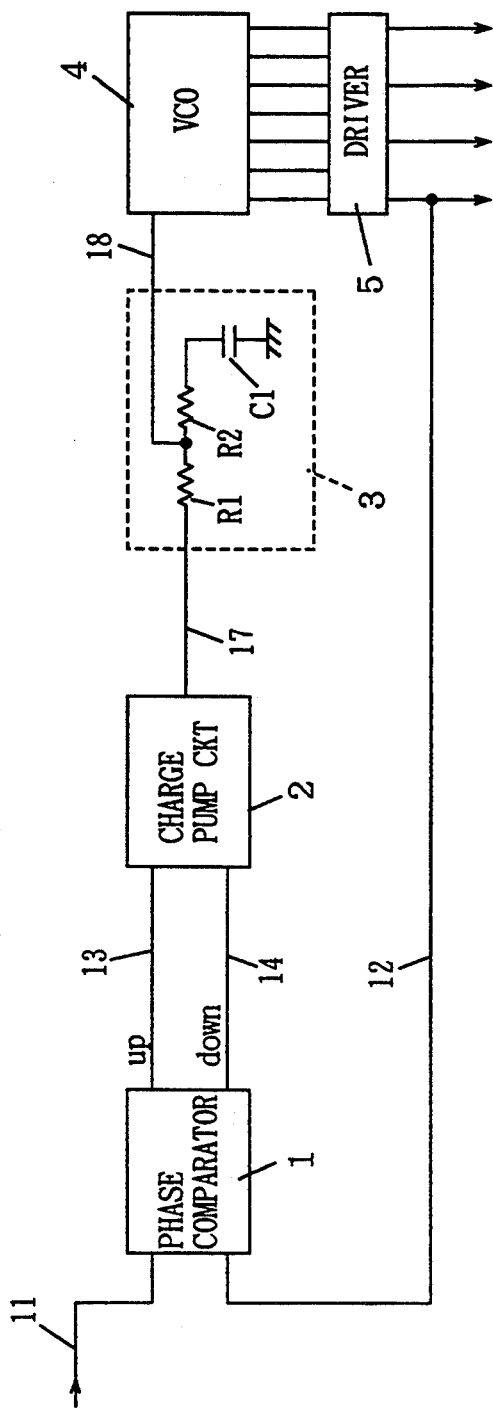
FIG. 26 is a block diagram of a PLL circuit apparatus of the background art.
Figure 27:
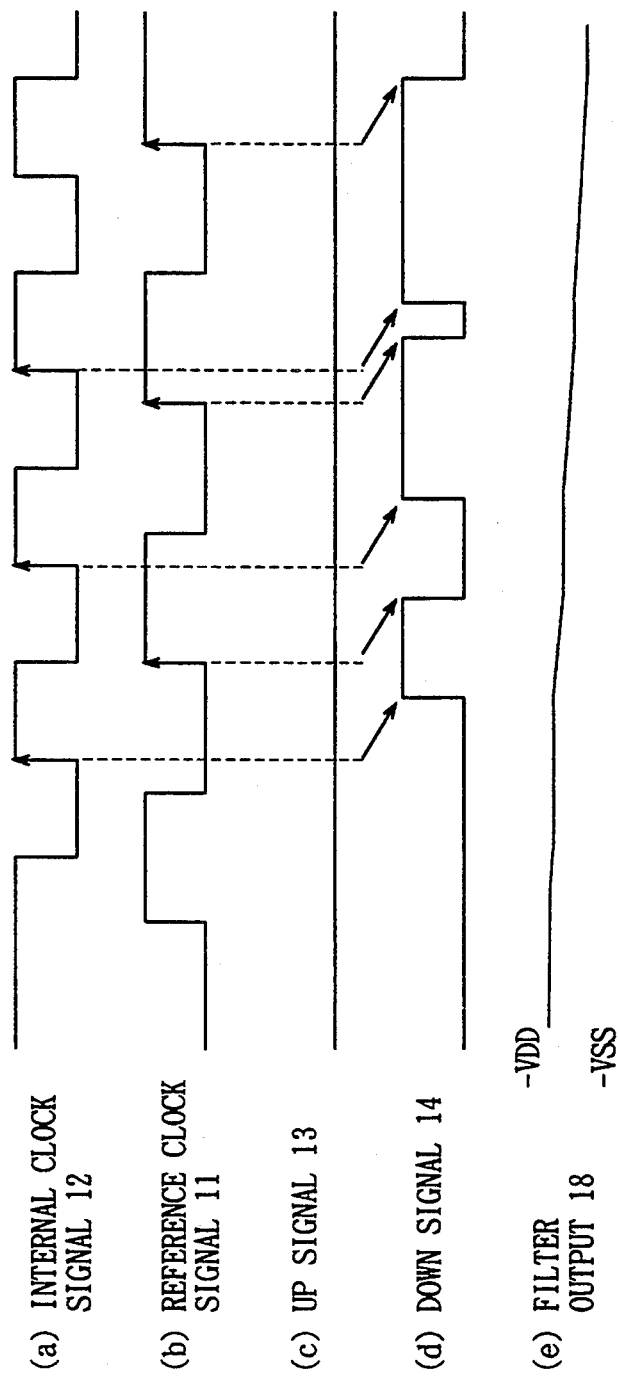
FIG. 27 is a timing chart showing an operation of the PLL circuit apparatus shown in FIG. 26 in case where the frequency of the internal clock signal is lower than that of the reference clock signal.
Figure 28:
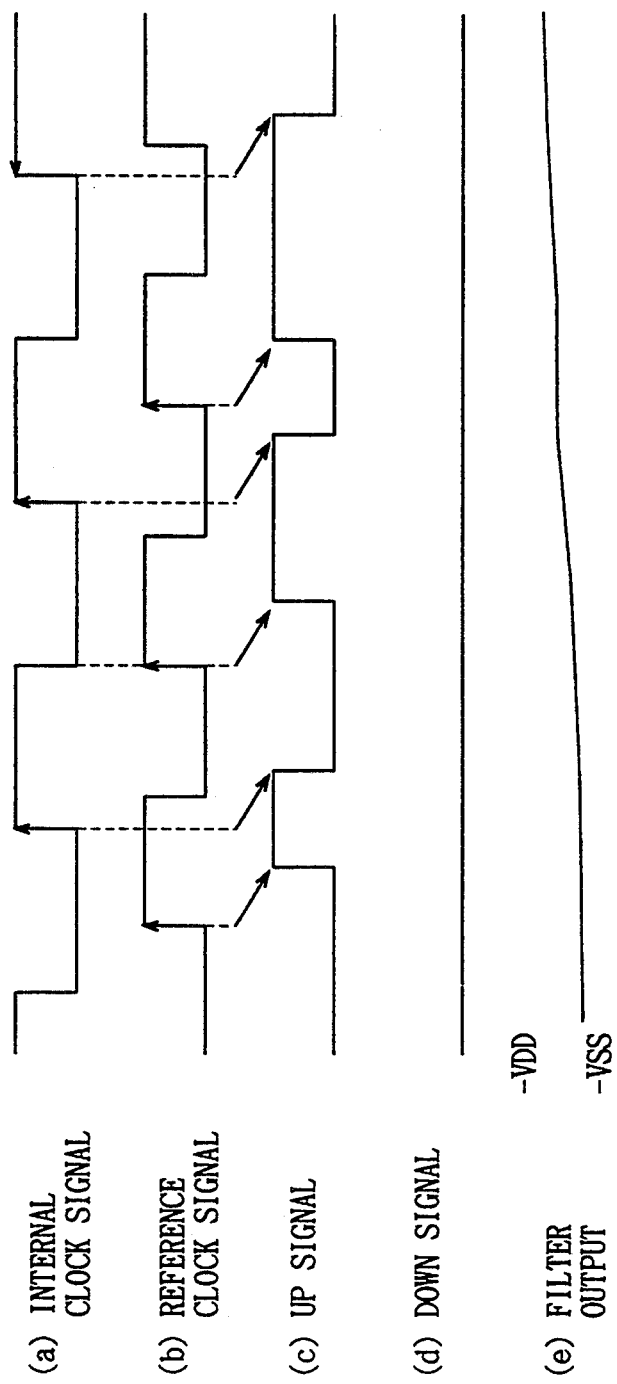
FIG. 28 is a timing chart showing the operation of the PLL circuit apparatus shown in FIG. 26 in a case where the frequency of the internal clock signal is higher than that of the reference clock signal.
Figure 29:
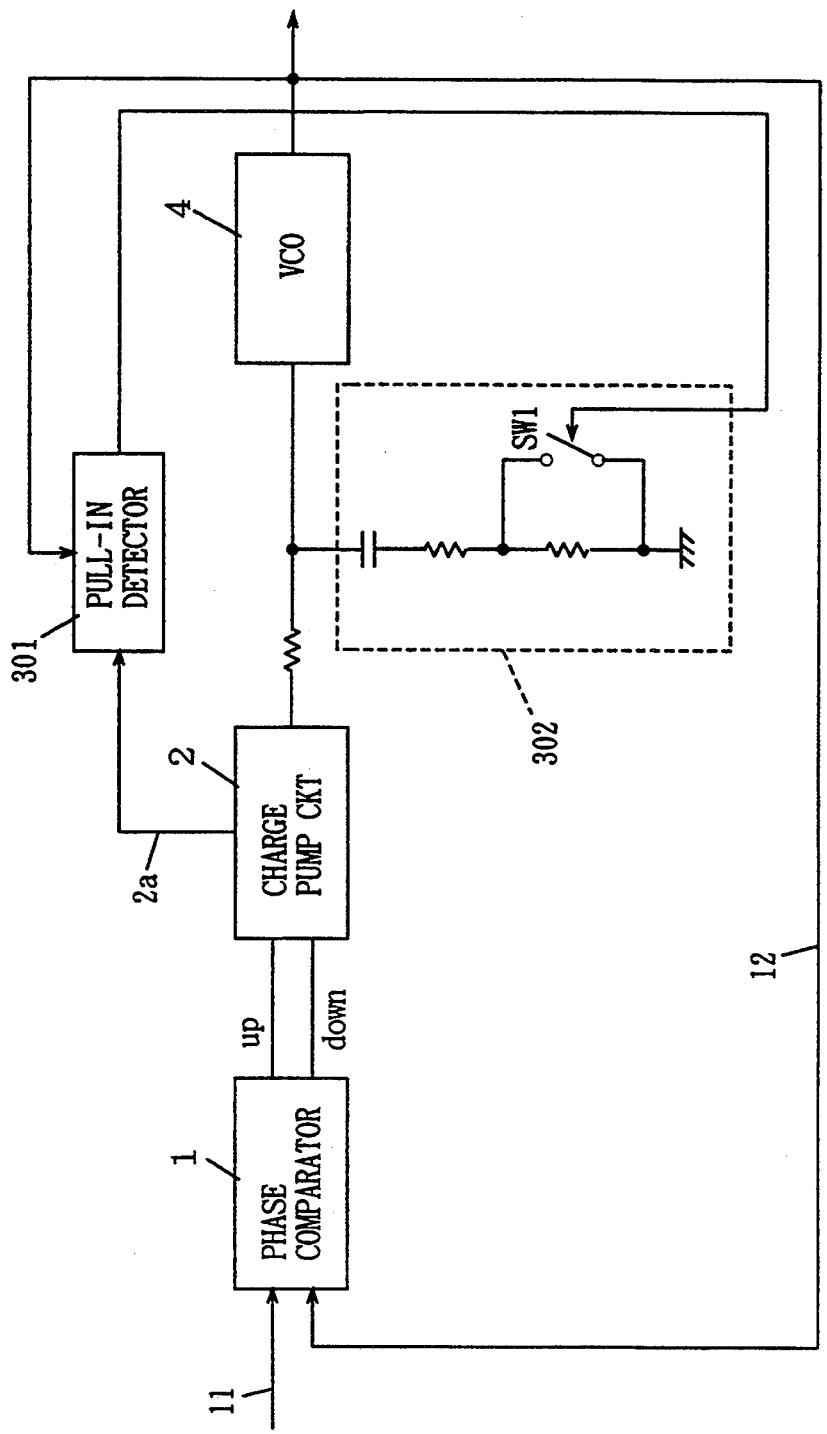
FIG. 29 is a block diagram showing another background art example of a PLL circuit apparatus.
Figure 30:
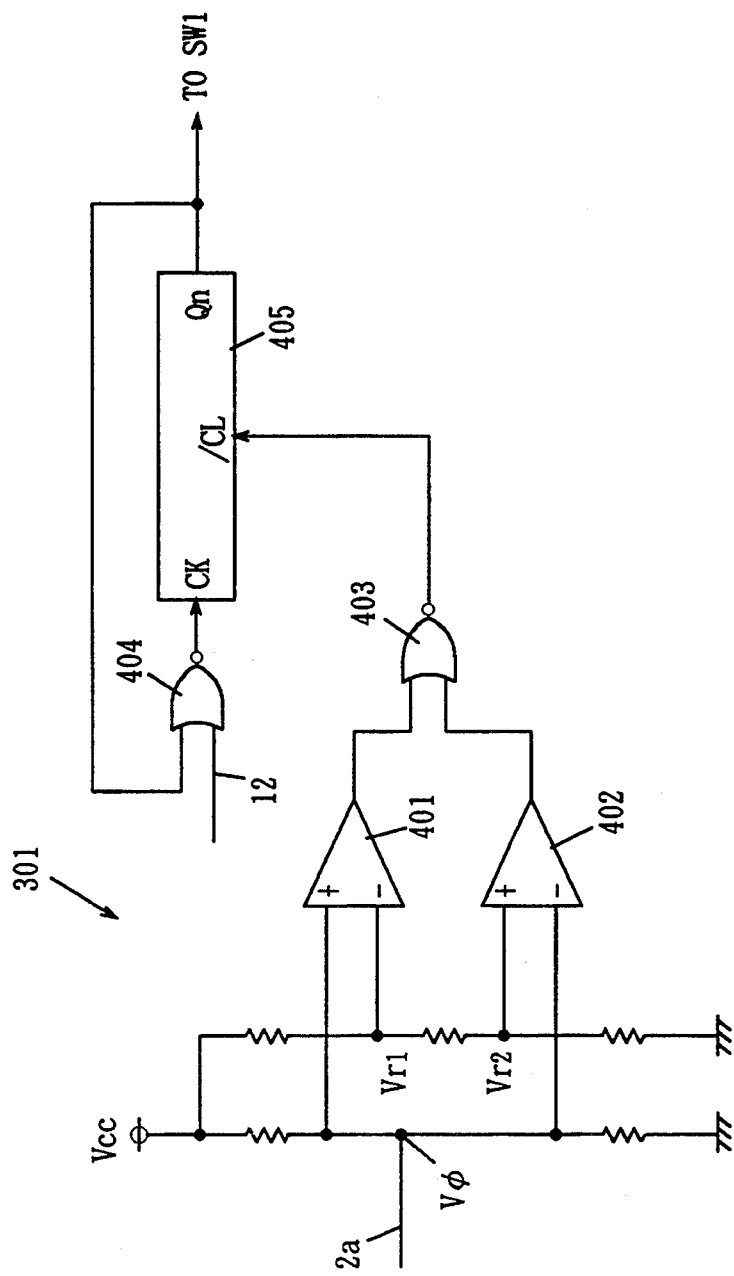
FIG. 30 is a circuit diagram of a pull-in detector shown in FIG. 29.

FIG. 21 is a timing chart showing an input/output of the reset portion 41A; FIG. 22 is a timing chart showing an input/output of the holding portion 43A; FIG. 23 is a timing chart showing an example of determination in accordance with a 3-point determining system in the reset portion 43A; and FIG. 24 shows a truth table of the contention preventing portion 46.

First, the set portion 41A determines whether a phase difference (a point A in FIG. 21) between a rising edge of a reference clock signal and a rising edge of an internal clock signal is not less than one period length of the reference clock signal (the reference clock signal is advanced in phase).

Initially, an up signal (low active) from the phase comparator 1 (FIG. 18) is sampled by a transfer gate which is rendered conductive during a period of which the reference clock signal is at a high level. A falling edge of the up signal output from the phase comparator is dominated by the rising edge of the reference clock signal and is output in slight delay from the rising edge of the reference clock signal. On the basis of this phenomenon, it can be determined that if the transfer gate carries out sampling in response to the rising edge of the reference clock signal as shown in FIG. 21, a period for which the up signal is at a low level, i.e., the rising edge of the internal clock signal is delayed by one period or more from the rising edge of the reference clock signal. This data is held by the latch circuit comprised of the inverters 61A and 61B. The held data is output to the gain control signal generating portion 44A in response to the next rising edge of the reference clock signal.

As shown in FIG. 22, the holding portion 42A holds the logic states of the internal clock signal at three points in total including two rising edges and one falling edge of the reference clock signal. On a circuit basis, a transfer gate comprised of the NMOS transistor 63A and the PMOS transistor 63B responds to the rising edge of the reference clock signal to sample the internal clock signal and input the sampled signal to the 3-stage shift register. Similarly, a transmission gate comprised of the NMOS transistor 76A and the PMOS transistor 76B responds to the falling edge of the reference clock signal to sample the internal clock signal and input the sampled signal to the 2-stage shift register.

The 3-stage shift register and the 2-stage shift register hold therein rising data of a point A (an output of the inverter 68A) of FIG. 22, rising data of a point C (an output of the inverter 64A) and falling data of a point B (an output of the inverter 74). The held data are output at timing D to the reset portion 43A. Circuitry for outputting those data includes a transmission gate comprised of the MOS transistors 69A and 69B, a transmission gate comprised of the MOS transistors 65A and 65B, and a transmission gate comprised of the MOS transistors 75A and 75B.

The reset portion 43A determines the data output from the holding portion 42A by using a circuit which is a combination of the EX-NOR gate 94, the EX-OR gate 95 and the NAND gate 96. When it is determined that the data A and C match each other and the data A and B mismatch each other, the reset signal S2 is output to the gain control signal generating portion 44A.

While there is a case where the determination cannot be made immediately by the above-described determination method, a description will now be made as to how the determination is made depending on internal clock signals 2–4, assuming various cases shown in FIG. 23. The internal clock signal 2 of FIG. 23 cannot be detected at points A, B and C, however, it can be detected indispensably at three points (C, D and E) of the next cycle. This delay does not adversely affect a phase detecting circuit or a PLL circuit, resulting in shortening of a pull-in time. Conversely, the delay exerts good influences on the phase detecting circuit and the PLL circuit. In addition, it seems at first sight as if the internal clock signal 3 of FIG. 23 cannot be detected; however, in such a case that the reference clock signal is advanced in phase, since the period of the internal clock signal becomes shorter due to characteristics of the PLL circuit, the internal clock signal 3 is also brought into the state of the internal clock signal 1 or 2 at a certain X value. Consequently, the internal clock signal 3 can be detected. In the case with the internal clock signal 4 causing an erroneous operation of this circuit, an output of the reset signal S2 causes a reset of the RS flipflop in the gain control signal generating portion 44. When the internal clock signal is advanced in phase, the set signal S1 is not output from the set portion 41A, and hence, even if the reset signal S2 is output several times from the NAND gate 26 in this state, no adverse influences are exerted on the gain control signal.

The gain control signal generating portion 44A includes an RS flipflop comprised of NAND gates 97 and 98. If one period length of the internal clock signal is not less than a two period length of the reference clock signal (the reference clock signal is advanced in phase), the set signal S1 is input to a set side of the RS flipflop. If one period length of the internal clock signal is in the range of one period length to a two period length of the reference clock signal (the reference clock signal is advanced in phase), the reset signal S2 is input to the reset side. During a period for which the internal clock signal is substantially delayed from the reference clock signal because of the above-described input, an up gain control signal (high active) is output continually from the NAND gate 97 to the contention preventing portion 46. Further, since the RS flipflop is a reset priority circuit, the NAND gate 93 is connected to the set side so as to avoid a simultaneous input of the set signal S1 and the reset signal S2.

Conversely, if a NAND gate is not provided on the reset side and connected to the set side of the RS flipflop to form a reset priority circuit, then the period of generation of the gain control signal can be made longer than that in the case where the reset priority circuit is connected.

Although the set portion 41B, the holding portion 42B, the reset portion 43B and the gain control signal generating portion 44B are of circuit configurations having the same function as those of the above-described portions 41A–44A, they are different from the portions 41A–44A in the following point. That is, an input reference clock signal and an internal clock signal are inverted, the delay of the reference clock signal with respect to the internal clock signal is determined, and a down gain control signal (low active) is output to the contention preventing portion 46 from an output of the NAND gate 104 of the RS flipflop comprised of the NAND gates 104 and 105.

The contention preventing portion 46 prevents a simultaneous input of the up gain control signal (high active) and the down gain control signal (low active). The portion 46 outputs a gain control signal in accordance with the truth table shown in FIG. 23. An output of the NAND gate 106 is low active, while an output of the NOR gate 107 is highly active.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A phase-locked loop apparatus of an analog control type, comprising:
   integrating means for performing an integrating operation of an input signal;
   internal clock signal generating means responsive to an output of said integrating means for generating an internal clock signal for internal synchronization;
   means for receiving an externally generated reference clock signal;
   phase difference detecting means for detecting a first phase difference between said externally generated reference clock signal and said internal clock signal for providing a phase difference detection pulse signal having a pulse width representing said first phase difference;
   integration control means responsive to said phase difference detection pulse signal from said phase difference detecting means for promoting a supply of said input signal by said integrating means;
   reference pulse width signal generating means for generating a reference pulse width signal having the same frequency as that of either said externally generated reference clock signal or said internal clock signal and of a predetermined pulse width;
   pulse width comparing means for comparing the pulse width of said phase difference detection pulse signal with the pulse width of said reference pulse width signal for providing an output signal representing a second phase difference of said phase difference detection pulse signal and said reference pulse width signal; and
   control means responsive to said second phase difference signal for controlling a manner of said integrating operation of said integrating means.

2. The PLL circuit apparatus as recited in claim 1, wherein
   said internal clock signal generating means includes controlled oscillating means for generating an oscillation signal having voltage an oscillation frequency changeable in accordance with an output level of said integrating means, and means for converting an output of said voltage controlled oscillating means to said internal clock signal.

3. The PLL circuit apparatus as recited in claim 1, wherein
   said phase difference detecting means outputs a first pulse signal for advancing a phase of said internal clock signal when the phase of said internal clock signal is delayed as compared to a phase of said reference clock signal, and said phase difference detecting means outputs a second pulse signal for delaying the phase of said internal clock signal when the phase of said internal clock signal is advanced as compared to the phase of said reference clock signal.

4. The PLL circuit apparatus as recited in claim 1, wherein
   said reference pulse width signal generating means includes phase control means for synchronizing the leading edge of said externally generated reference clock signal with the leading edge of an output of said phase difference detecting means.

5. The PLL circuit apparatus as recited in claim 1, wherein said reference pulse width signal generating means includes phase control means for synchronizing the leading edge of said internal clock signal with the trailing edge of an output of phase difference detecting means.

6. The PLL circuit apparatus as recited in claim 1, wherein
   said reference pulse width signal generating means includes delay means having delay time corresponding to said predetermined pulse width for delaying said phase difference detecting means.

7. The PLL circuit apparatus as recited in claim 1, wherein
   said reference pulse width comparing means includes, wherein frequency difference detecting means detects that a cycle of said internal clock signal is not less than double a cycle of said reference clock signal.

8. The PLL circuit apparatus as recited in claim 7, wherein
   said frequency difference detecting means includes logical evaluating means for evaluating a logical sum of the phase difference detection pulse signal from said phase difference detecting means and the reference pulse width signal from said reference pulse width signal generating means.

9. The PLL circuit apparatus as recited in claim 1, wherein
said integrating means includes a first gain setting circuit for setting a gain of a first stage, and a second gain setting circuit for setting a gain of a second stage; and
said control means includes switching means connected between said integration control means and said second gain setting circuit and switching on/off in response to the result of determination by said pulse width comparing means.

10. The PLL circuit apparatus as recited in claim 1 wherein
said integration control means includes
first charge pump means responsive to a phase difference detection signal from said phase difference detecting means for promoting a supply of charges to said integrating means;
second charge pump means responsive to a result of comparison by said pulse width comparing means for promoting a supply of charges to said integrating means.

11. A phase-locked loop apparatus of an analog control type, comprising:
integrating means having a plurality of gain constants for performing an integrating operation of an input signal;
internal clock signal generating means responsive to an output of said integrating means for generating an internal clock signal for internal synchronization;
means for receiving an externally generated reference clock signal;
phase difference detecting means for detecting a first phase difference between said externally generated reference clock signal and said internal clock signal for providing a phase difference detection pulse signal having a pulse width representing said first phase difference;
integration control means responsive to said phase difference detection pulse signal from said phase difference detecting means for controlling said integrating operation of said input signal by said integrating means;
a plurality of reference pulse width signal generating means responsive to said phase difference detection signal for each generating a reference pulse width signal having the same frequency as that of said phase difference detection pulse signal and different pulse width each other;
a plurality of pulse width comparing means provided corresponding to said plurality of said gain constants for each comparing the pulse width of said phase difference detection pulse signal with the pulse width of said reference pulse width signal for each providing an output signal representing a second phase difference of said phase difference detection pulse signal and said reference pulse width signal; and
a plurality of control means provided corresponding to said plurality of gain constants responsive to said second phase difference signal for controlling a manner of each said integrating operation of said integrating means.

12. The PLL circuit apparatus as recited in claim 11, wherein
each of said plurality of reference pulse width signal generating means includes a delay means having delay time corresponding to said pulse width for delaying said phase difference detection signal.

13. A phase-locked loop apparatus of an analog control type, comprising:
integrating means having at least two gain constants for performing an integrating operation of an input signal;
internal clock signal generating means responsive to an output of said integrating means for generating an internal clock signal for internal synchronization;
means for receiving an externally generated reference clock signal;
phase difference detecting means for detecting a first phase difference between said externally generated reference clock signal and said internal clock signal for providing a phase difference detection pulse signal having a pulse width representing said first phase difference;
integration control means responsive to said phase difference detection pulse signal from said phase difference detecting means for controlling said integrating operation of said input signal to said integrating means;
holding means responsive to either said externally generated reference clock signal or said internal clock signal for holding said phase difference detection pulse signal;
second phase difference detecting means for detecting that the phase difference between said internal clock signal and said reference clock signal is a predetermined time difference,
control means set in response to the phase difference detecting signal held by said holding means for maintaining said loop filter at a high gain, and reset in response to the phase difference detecting signal by said second phase difference detecting means for stopping said control signal.

14. The PLL circuit apparatus as recited in claim 13, wherein
said predetermined time difference is in the range of a ½ period length to one period length of the reference clock signal or the internal clock signal.

15. The PLL circuit apparatus as recited in claim 13, wherein
said second phase difference detecting means includes:
logic state holding means for holding logic states of one clock signal of said reference clock signal and said internal clock signal at two leading edges and a trailing edge between said two leading edges of the other clock signal, and
determining means for determining that the phase difference between said reference clock signal and said internal clock signal is said predetermined time difference on the basis of the logic state of one clock signal held by said logic state holding means.

16. A phase difference detecting circuit apparatus for use in a PLL circuit apparatus of an analog control system which includes a phase comparator, a loop filter and a charge pump, said phase comparator detecting a phase difference between an externally generated reference clock signal and an internally generated reference clock signal and outputting a first phase difference detecting signal, said apparatus comprising:
holding means responsive to said reference clock signal or an internal clock signal for holding said first phase difference detecting signal;

determining means for determining logic states of one clock-signal of said reference clock signal and said internal clock signal at two leading edges and a trailing edge between said two leading edges of the other clock signal; and control signal generating/stopping means responsive to an output of said holding means for generating a control signal for maintaining said loop filter at a high gain, and responsive to a determination signal from said determining means for stopping the generation of said control signal.

17. The phase difference detecting circuit apparatus as recited in claim 16, wherein said control signal generating/stopping means includes:

control signal holding means having a set and reset function, set means responsive to an output of said holding means for generating a signal for setting said control signal holding means, and reset means responsive to a determination signal from said determining means for generating a signal for resetting said control signal holding means.

18. The phase difference detecting circuit apparatus as recited in claim 17, wherein a control signal output from said control signal holding means includes a first gain control signal for advancing a phase of said internal clock signal and a second gain control signal for delaying the phase of said internal clock signal, and said control signal holding means includes means for preventing contention between said first and second gain control signals.

19. The apparatus as recited in claim 16, wherein said determining means includes:

match detecting means for detecting that the logic states of one of the clock signals at said two leading edges match each other, mismatch detecting means for detecting that the logic state of one clock signal at said leasing edges mismatch the logic state of the clock signal at said trailing edge, and AND means for taking AND of an output of said match detecting means and an output of said mismatch detecting means.

20. The apparatus as recited in claim 19, wherein said determining means determines whether one period length of one clock signal is in the range of one period length to a two period length of the other clock signal.

* * * * *